(12) United States Patent
Horesh et al.

(10) Patent No.: US 8,593,881 B2
(45) Date of Patent: Nov. 26, 2013

(54) PRE-CHARGE SENSING SCHEME FOR NON-VOLATILE MEMORY (NVM)

(75) Inventors: Yaal Horesh, Zichron Yaakov (IL); Oleg Dadashev, Hadera (IL); Yoram Betser, Mazkeret Batya (IL); Avri Harush, Kyriat Bialik (IL)

(73) Assignee: Spansion Israel Ltd, Netanya (IL)

( * ) Notice: Subject to any disclaimer, the term of this patent is extended or adjusted under 35 U.S.C. 154(b) by 66 days.

(21) Appl. No.: 13/301,826

(22) Filed: Nov. 22, 2011

(65) Prior Publication Data

US 2012/0063238 A1 Mar. 15, 2012

Related U.S. Application Data

(62) Division of application No. 12/232,437, filed on Sep. 17, 2008, now Pat. No. 8,098,525.

(60) Provisional application No. 61/006,039, filed on Dec. 17, 2007, provisional application No. 60/972,840, filed on Sep. 17, 2007.

(51) Int. Cl.
*G11C 16/04* (2006.01)

(52) U.S. Cl.
USPC ............ 365/185.25; 365/185.13; 365/185.18; 365/185.23

(58) Field of Classification Search
USPC .............. 365/185.25, 185.23, 185.18, 185.13
See application file for complete search history.

(56) References Cited

U.S. PATENT DOCUMENTS

| | | | |
|---|---|---|---|
| 5,315,541 A | 5/1994 | Harari et al. | |
| 5,432,730 A | 7/1995 | Shubat et al. | |
| 5,886,923 A * | 3/1999 | Hung | 365/185.11 |
| 5,991,198 A * | 11/1999 | Song et al. | 365/185.11 |
| 6,891,755 B2 * | 5/2005 | Silvagni et al. | 365/185.13 |
| 7,239,565 B2 | 7/2007 | Liu | |
| 7,263,003 B2 * | 8/2007 | Edahiro et al. | 365/185.25 |
| 7,345,916 B2 | 3/2008 | Yang et al. | |
| 7,633,809 B2 | 12/2009 | Kajiyama | |
| 8,098,525 B2 * | 1/2012 | Horesh et al. | 365/185.13 |

* cited by examiner

*Primary Examiner* — Pho M Luu
(74) *Attorney, Agent, or Firm* — Eitan, Mehulal & Sadot

(57) ABSTRACT

The pipe effect can significantly degrade flash performance. A method to significantly reduce pipe current and (or neighbor current using a pre-charge sequence) is disclosed. A dedicated read order keeps the sensing node facing the section of the pipe which was pre-charged. The technique involves pre-charging several global bitlines (such as metal bitlines, or MBLs) and local bitlines (such as diffusion bitlines, or DBLs). The pre-charged global bitlines are selected according to a pre-defined table per each address. The selection of the global bitlines is done according to whether these global bitlines will interfere with the pipe during the next read cycle.

5 Claims, 15 Drawing Sheets

Read Logic Address 0, cell "a"

Read Logic Address 1, cell "c"

Read Logic Address 3, cell "g"

Read Logic Address 4, cell "i"

Read Logic Address 5, cell "k"

Pre-Charge Phase

Read Logic Address 6, cell "m"

Read Logic Address 7, cell "o"

Pre-charge Phase

Read cell "k"

Pre-charge Phase

Read cell "m"

PRE-CHARGE SENSING SCHEME FOR NON-VOLATILE MEMORY (NVM)

CROSS-REFERENCE(S) TO RELATED APPLICATION(S)

This application is a divisional application of U.S. patent application Ser. No. 12/232,437 filed Sep. 17, 2008, which has matured into U.S. Pat. No. 8,098,525; and which claims benefit of U.S. Provisional Patent Applications 61/006,039 filed Dec. 17, 2007, and 60/972,840 filed Sep. 17, 2007, all of which are hereby incorporated by reference in their entirety.

TECHNICAL FIELD

The disclosure relates to techniques for operating semiconductor devices and, more particularly, to operating non-volatile memory (NVM), such as floating gate (FG) devices or charge-trapping devices such as nitride read only memory (NROM), or other microelectronic cells or structures, such as reading (sensing the program state) of NVM cells.

BACKGROUND

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source (S), gate (G) and drain (D). In the FET, a small amount of voltage is applied to the gate (G) in order to control current flowing between the source (S) and the drain (D). In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 illustrates a FET 100 comprising a p-type substrate (or a p-well in the substrate), and two spaced-apart n-type diffusion areas—one of which will serve as the "source", the other of which will serve as the "drain" of the transistor. The space between the two diffusion areas is the "channel". A thin dielectric layer is disposed over the substrate in the neighborhood of the channel, and a "gate" structure is disposed over the dielectric layer atop the channel. (The dielectric under the gate is also commonly referred to as "gate oxide" or "gate dielectric".) Electrical connections (not shown) may be made to the source, the drain, and the gate. The substrate may be grounded, or it may be biased at a desired voltage depending on applications.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between the source and the drain).

FET 100 is exemplary of a MOSFET (metal oxide semiconductor FET) transistor. With the specified "n" and "p" types shown above, an "n-channel MOSFET" can be formed. With opposite polarities (swapping "p" for "n" in the diffusions, and "n" for "p" in the substrate or well), a p-channel FET can be formed. In CMOS (complementary metal oxide semiconductor), both n-channel and p-channel MOS transistors may be used, and are often paired with one another.

An integrated circuit (IC) device may comprise many millions of FETs on a single semiconductor "chip" (or "die"), measuring only a few centimeters on each side. Several IC chips may be formed simultaneously, on a single "wafer", using conventional semiconductor fabrication processes including deposition, doping, photolithography, and etching. After all the chips are formed, they can be singulated from the wafer.

The Floating Gate Transistor

A floating gate transistor is generally a transistor structure, broadly based on the FET, as described hereinabove. As illustrated in FIG. 2, the floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described hereinbelow.

The floating gate is disposed over tunnel oxide (comparable to the gate oxide of the FET). The floating gate is a conductor, and the tunnel oxide is an insulator (dielectric material). Another layer of oxide (interpoly oxide, also a dielectric material) separates the floating gate from the control gate.

Since the floating gate is a conductor, and is surrounded by dielectric material, it can store a charge. Electrons can move around freely within the conductive material of the floating gate (which comports with the basic definition of a "conductor").

Since the floating gate can store a charge, it can exert a field effect on the channel region between the source and the drain, in a manner similar to how a normal FET works, as described hereinabove. Mechanisms for storing charges on the floating gate structure, as well as removing charges from the floating gate, are described hereinbelow.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described hereinbelow.

Normally, the floating gate non-volatile memory (NVM) cell has only a single "charge-storing area"—namely, the conductive floating gate (FG) structure, and can therefore only store a single bit of information (binary "1" or binary "0"). More recently, using a technology referred to as "multilevel cell" (MLC), two or more bits can be stored in and read from the floating gate cell.

The NROM Memory Cell

Another type of memory cell, called a "nitride, read only memory" (NROM) cell, has a charge-storage structure which is different from that of the floating gate memory cell and which permits charges to be stored (or trapped) in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being free to move around as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage. Using MLC technology, at least two bits can be stored in and read from each of the two portions (charge storage areas) of the charge-trapping medium (for a total of 4 bits), similarly 3 bits or more than 4 bits may be identified.

FIG. 3 illustrates a basic NROM memory cell 300, which may be viewed as an FET with an "ONO" structure inserted between the gate and the substrate. (One might say that the ONO structure is "substituted" for the gate oxide of the FET.)

The ONO structure is a stack (or "sandwich") of bottom (lower) oxide 322, a charge-trapping material such as nitride 324, and a top (upper) oxide 326. The ONO structure may have an overall thickness of approximately 10-25 nm, such as 18 nm, as follows:

the bottom oxide layer 322 may be from 3 to 6 nm, for example 4 nm thick;

the middle nitride layer 324 may be from 3 to 8 nm, for example 4 nm thick; and the top oxide layer 326 may be from 5 to 15 nm, for example 10 nm thick.

The NROM memory cell has two spaced apart diffusions 314 and 316 (which can function as source and drain, as discussed hereinbelow), and a channel region 320 defined in the substrate 312 between the two diffusion regions 314 and 316, and a gate 328 disposed above the ONO stack 321.

In FIG. 3, the diffusions are labeled "N+". This means that they are regions in the substrate that have been doped with an electron donor material, such as phosphorous or arsenic. These diffusions are typically created in a larger region which is a p-type cell well (CW) doped with boron (or indium or both). This is the normal "polarity" for an NVM cell employing electron injection (but which may also employ hole injection, such as for erase). With opposite polarity (boron or indium implants in an n-type cell well), the primary injection mechanism would be for holes, which is generally accepted to be not as effective as electron injection. One skilled in the art will recognize that the concepts disclosed herein can be applied to opposite polarity devices.

The charge-trapping material 324 is non-conductive, and therefore, although electrical charges can be stored in the charge-trapping material, they are not free to move around, they will generally stay where they are stored. Nitride is a suitable charge-trapping material. Charge trapping materials other than nitride may also be suitable for use as the charge-trapping medium. One such material is silicon dioxide with buried polysilicon islands. A layer (324) of silicon dioxide with polysilicon islands would be sandwiched between the two layers of oxide (322) and (326). Alternatively, the charge-trapping layer 324 may be constructed by implanting an impurity, such as arsenic, into a layer of silicon dioxide deposited on top of the bottom oxide 322.

Memory cell 300 is generally capable of storing at least two bits of data—at least one bit(s) in a first storage area of the nitride layer 324 represented by the dashed circle 323, and at least one bit(s) in a second storage area of the nitride layer 324 represented by the dashed circle 325. Thus, the NROM memory cell can be considered to comprise two "half cells", each half cell capable of storing at least one bit(s). It should be understood that a half cell is not a physically separate structure from another half cell in the same memory cell. The term "half cell", as it may be used herein, is used herein only to refer to the "left" or "right" bit storage area of the ONO stack 321 (nitride layer 324). Storage areas 325, 323 may variously be referred to as "charge storage areas", "charge trapping areas", and the like, throughout this document. (The two charge storage areas may also be referred to as the right and left "bits".)

Each of storage areas 325, 323 in the charge-trapping material 324 can exert a field effect on the channel region 320 between the source and the drain, in a manner similar to how a normal FET works, as described hereinabove (FIG. 2).

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed so that the charged state represents binary "0" and the discharged state represents binary "1".) That represents the programming "half" of how an NROM memory cell operates. The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is.

Modes of Operation

Generally, the modes of operation for any NVM memory cell (either floating gate or NROM) include "program", "erase" and "read". Modes of operation for NROM are now discussed.

Program generally involves injecting electrons into the charge storage areas of the NROM or other NVM cell, typically by a process known as channel hot electron (CHE) injection. Exemplary voltages to program (by CHE injection of electrons) the right bit (right bit storage area) of an NROM cell may include:

the left BL (acting as source, Vs) is set to 0 volts the right BL (acting as drain, Vd) is set to +5 volts the gate (Vg) is set to +8-10 volts the substrate (Vb) is set to 0 volts and the bit storage area above the drain (right BL) becomes programmed To program the left bit storage area, source and drain are reversed—the left bitline serves as the drain and the right bitline serves as the source.

Erase may involve injecting holes into the charge storage areas of the NROM cell, typically by a process known as hot hole injection (HHI). Generally, holes cancel out electrons (they are electrically opposite), on a one-to-one basis. Exemplary voltages to erase (by HHI injection of holes) the right bit of an NROM cell may include:

the left BL (acting as source, Vs) is set to float the right BL (acting as drain, Vd) is set to +5 volts the gate (Vg) is set to −7 volts the substrate (Vb) is set to 0 volts and the bit storage area above the drain (right BL) becomes erased. To erase the left bit storage area, source and drain are reversed—the left bitline serves as the drain, and the right bitline serves as the source.

Read may involve applying voltages to the terminals of the memory cell and, based on subsequent current flow, ascertaining the threshold voltage of the charge storage area within the cell. Generally, to read the right bit of the NROM cell, using "reverse read", the right BL (acting as source, Vs) is set to 0 volts
the left BL (acting as drain, Vd) is set to +2 volts
the gate (Vg) is set to +5 volts
the substrate (Vb) is set to 0 volts and the bit storage area above the source (right BL) can be read. To read the left bit storage area, source and drain are reversed—the left bitline serves as the source, and the right bitline serves as the drain.

"Reading" an NROM Cell

Reading an NROM memory cell may involve applying voltages to the terminals of the memory cell comparable to those used to read a floating gate memory cell, but reading may be performed in a direction opposite to that of programming Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction and reading is performed in what is termed the opposite or reverse direction. For example, generally, to program the right storage area 323 (in other words, to program the right "bit"), electrons flow from left (source) to right (drain). To read the right storage area 323 (in other words, to read the right "bit"), voltages are applied to cause electrons to flow from right to left, in the opposite or reverse direction. For example, generally, to program the left storage area 325 (in other words, to program the left "bit"), electrons flow from right (source) to left (drain). To read the left storage area 325 (in other words, to read the left "bit"), voltages are applied to cause electrons to flow from left to right, in the opposite or reverse direction. See, for example, U.S. Pat. No. 6,768,165.

"Read" is generally done by measuring the Vt of a cell (or half-cell), and associating the measured Vt with a program level (such as "0" or "1"). Although the Vts of the cells are measured on an individual basis, it is generally necessary to determine a distribution of Vts for many cells in order to associate the measured Vt of a given cell with a program level, with confidence. For example—if only one cell were to be read, and its threshold voltage were to be found to be at or very near the RV between two program levels, it may be difficult to say, with certainty, at which of two program levels the single cell was programmed, since its threshold voltage may have moved slightly upward or slightly downward since it was programmed. This is a benefit of reading bits one block at a time—to obtain a statistically meaningful sample of Vt's across a number of cells.

Memory Array Architecture, Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

As discussed hereinabove, each memory cell comprises a first diffusion (functioning as source or drain), a second diffusion (functioning as drain or source) and a gate, each of which has to receive voltage in order for the cell to be operated, as discussed hereinabove. Generally, the first diffusions (usually designated "source") of a plurality of memory cells are connected to a first bit line, which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

The bitlines may be "buried bitline" diffusions in the substrate, and may serve as the source/drain diffusions for the memory cells. The wordlines may be polysilicon structures and may serve as the gate elements for the memory cells.

FIG. 4 illustrates an array of NROM memory cells (labeled "a" through "i") connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 4 are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f". In this example, the memory cells "e" and "f" have two of their three terminals connected together.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

The bitlines (BLs) mentioned above may extend in parallel with one another, through the array (or a portion thereof). A single buried bitline (BB) may be a single diffusion shared by two adjacent cell transistors, and may be referred to herein as a diffusion bitline (DBL). The diffusion bitline (DBL) is a diffusion, functioning as a conductive line, which is physically disposed ("buried") within the surface of the substrate.

A cell transistor may be formed by an ONO stack, which is disposed on the surface of the substrate, generally between adjacent bitlines (BB, dbl). The ONO stack includes a layer of silicon nitride (nitride), which can trap (store) electrons and holes. A gate electrode, which may be doped (to be conductive) polysilicon, is disposed on the ONO stack, and may be a portion of an elongate wordline extending through the array (or a portion thereof).

An inter-level dielectric (ILD) may be disposed on the substrate to support patterns of metallization for interconnecting cell transistors. A portion of the pattern may comprise metal bitlines (MBLs). Contacts to the buried bitlines may be made by metal-filled plugs extending through the ILD to the buried bitlines, such as at intervals of every 16 cells. (It is generally not necessary to have one bitline contact per cell, and a contact area occupies area which otherwise could be used for cell transistors.)

In some of the memory array illustrations presented herein, the wordlines may extend horizontally through the array (or a portion thereof), and the bitlines may extend vertically through the array (or a portion thereof), intersecting the wordlines at right angles (90 degrees) thereto. Or, in some of the illustrations, the memory array may be rotated so that the wordlines extend vertically and the bitlines extend horizontally.

Generally, the cell transistors described herein may be "dual bit" transistors, such as NROM, having two bit storage (charge-trapping) areas which may be referred to as the "left bit" and the "right bit".

Drain-Side and Source-Side Sensing

Generally, for an NROM cell having two bit storage areas, one over the drain (D) and another over the source (S), reading the bit over the source (S) may be performed by setting the drain "read" voltage (Vdr) to approximately +2 volts, such as 1.4 volts, and setting the source voltage (Vs) to 0 volts (or ground). For example, with reference to FIG. 3, to read the "right" bit 323, use the left diffusion 314 as drain (D) and the right diffusion 316 as source (S). To read the "left" bit 325, use the right diffusion 316 as drain (D) and the left diffusion 314 as source (S).

With Vdr on the drain (D), the program level (as represented by Vt) stored over the source (S) may be sensed. Generally, to sense the Vt, current is measured, such as the current flowing into the drain (D) or the current coming out of the source (S). Either the drain (D) or the source (S) may be used as the "sensing node".

Parasitic Capacitances

An issue being addressed by the present disclosure is parasitic capacitance, and the effects thereof.

Generally, in any electronic device, wherever there are two conductors (separated by an insulator), there are capacitances. In some cases, capacitors are advertently constructed, such as in DRAM cells for storing charges, and are considered to be desirable. However, in many cases, the mere presence of conductive lines and elements can introduce "stray", generally undesirable capacitances, referred to herein as "parasitic capacitances". A reason that these parasitic capacitances are generally undesirable, in the context of reading memory cells, is that they can "steal" charge, by providing a "leakage" path. So, for example, when trying to read a memory cell programmed to a given voltage, the measured current may appear sufficiently lower to result in a false (erroneous) reading. When current leaks, voltage drops, generally according to the well known Ohm's law where E (voltage)=I (current) times R (resistance). More current leaking means more voltage dropping.

With so many conductive structures crammed together in very small spaces, for example, when operating one metal bitline (MBL) to read the contents of a memory cell, stray capacitance from adjacent MBLs (or LBLs) may cause voltage drops leading to false readings.

This issue is addressed, for example, in US Patent Publication No. 2003/0202411, incorporated by reference in its entirety herein, which discloses a system for control of precharge levels in a memory device. As noted therein, some terminals in an array of memory cells may be charged-up to prevent leakage currents which would otherwise adversely influence reading the contents of memory cells.

Pipe Effect Problem Description

In a Virtual Ground Array (VGA), or any other topological architecture where there is an electrical connection between neighboring cells, there is a possibility of current leaking to the neighboring cells, charging the parasitic capacitance associated with these cells (diffusion bit lines—DBLs) and other capacitances which may be connected to these cells.

This parasitic current will affect the sensing current, and thus will create "cross-talk" between cells. (Cross-talk is when the value of one memory cell affects the sensed value of another, typically neighboring, cell. Cross-talk is a different issue than disturb or retention or endurance.)

A "pipe effect" is typically caused due to a difference between the drain/source voltage level of the cell that is being read, to the pipe's, (neighbor cell's) voltage level. The pipe current can either increase or reduce the sensed current, and thus change the apparent logical value of the flash cell. This can be particularly troublesome when reading the contents of multi-level cells. The magnitude of the pipe problem depends on the neighboring flash cell's operating condition (erased or programmed), on the temperature, the word-line level, the parasitic capacitance and more. Thus, it cannot readily be compensated by a simple shift in some parameter or another (such as gate voltage or drain voltage, for example), but should be eliminated as much as possible.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array, or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NVM and related technologies may be found at "Non Volatile Memory Technology", Vol. 1 & 2 (2005), Vol. 3 (2006) and Vol. 4 (2007), published by Saifun Semiconductor; "Microchip Fabrication", by Peter Van Zant, $5^{th}$ Edition 2004; "Application-Specific Integrated Circuits" by Michael John Sebastian Smith, 1997; "Semiconductor and Electronic Devices", by Adir Bar-Lev, $2^{nd}$ Edition, 1999; "Digital Integrated Circuits" by Jan M. Rabaey, Anantha Chandrakasan and Borivoje Nikolic, 2$^{nd}$ Edition, 2002 and materials presented at and through http://siliconnexus.com, "Design Considerations in Scaled SONOS Nonvolatile Memory Devices" found at: http://klabs.org/richcontent/MemoryContent/nvmtsymp/nvmts_2000/presentations/buwhites_onos_lehigh_univ.pdf, "SONOS Nonvolatile Semiconductor Memories for Space and Military Applications" found at: http://klabs.org/richcontent/MemoryContent/nvmtsymp/nvmts_2000/papers/adams_d.pdf, "Philips Research-Technologies-Embedded Nonvolatile Memories" found at: http://www.research.philips.com/technologies/ics/nvmemoriesindex.html, and "Semiconductor Memory: Non-Volatile Memory (NVM)" found at: http://www.ece.nus.edu.sg/stfpage/elezhucx/myweb/NVM.pdf, all of which are incorporated by reference herein in their entirety.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

array memory cells may optionally be organized in an array of rows and columns, and may be connected to selected bit lines and word lines in the array. The array may be organized into various logical sections containing pluralities of memory cells, such as blocks, pages and sectors. Some of these sections may be physically isolated and operated independently from one another.

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of an NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

BL short for bit line. The bit line is a conductor connected to the drain (or source) of a memory cell transistor.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).

erase a method to erase data on a large set of bits in the array, such as by applying a voltage scheme that inject holes or remove electrons in the bit set. This method causes all bits to reach a low Vt level.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate (G), drain (D) and source (S).

FG short for floating gate. The floating-gate transistor is a kind of transistor that is commonly used for non-volatile storage such as flash, EPROM and EEPROM memory. Floating-gate transistors are almost always floating-gate MOSFETs. Floating-gate MOSFETs are useful because of their ability to store an electrical charge for extended periods of time even without a connection to a power supply.

Flash memory Flash memory is a form of non-volatile memory (EEPROM) that can be electrically erased and reprogrammed Flash memory architecture allows multiple memory locations to be erased or written in one programming operation. Two common types of flash memory are NOR and NAND flash. NOR and NAND flash get their names from the structure of the interconnections between memory cells. In NOR flash, cells are connected in parallel to the bit lines, allowing cells to be read and programmed individually. The parallel connection of cells resembles the parallel connection of transistors in a CMOS NOR gate. In NAND flash, cells are connected in series, resembling a NAND gate, and preventing cells from being read and programmed individually: the cells connected in series must be read in series.

Some systems will use a combination of NOR and NAND memories, where a smaller NOR memory is used as software ROM, and a larger NAND memory is partitioned with a file system for use as a random access storage area. NAND is best suited to flash devices requiring high capacity data storage. This type of flash architecture combines higher storage space with faster erase, write, and read capabilities over the execute in place advantage of the NOR architecture. See NAND, NOR.

half cell "half cell" (or "half-cell") is a term which is sometimes used to refer to the two distinct charge storage areas (left and right bits) of an NROM memory cell.

ILD short for inter-level (or inter-layer) dielectric. Generally, ILD is a relatively thick layer of oxide deposited on completed underlying structures (such as FETs), which will support a layer(s) of metal lines interconnecting the various underlying structures. Holes may be etched through the ILD and filled with metal to make contact with elements (such as source, drain, gate) of the underlying structures.

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

NAND NAND flash architecture memories are accessed much like block devices such as hard disks or memory cards. The pages are typically 512 or 2,048 or 4,096 bytes in size. Associated with each page are usually a few bytes (typically 12-16 bytes) that are used for storage of an error detection (ED) and correction checksum. The pages are typically arranged in blocks, such as 32 pages of 512 bytes, 64 pages of 2,048 bytes, or 64 pages of 4,096 bytes. With NAND architecture, programming may be performed on a page basis, but erasure can only be performed on a block basis.

Most NAND devices are shipped from the factory with some bad blocks, which are typically identified and marked according to a specified bad block marking strategy. The first physical block (block 0) is always guaranteed to be readable and free from errors. Hence, all vital pointers for partitioning and bad block management for the device are located inside this block (typically a pointer to the bad block tables). If the device is used for booting a system, this block may contain the master boot record.

nitride commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask or, in the case of an NVM memory cell having an ONO layer, as a charge-trapping material.

NOR Reading from NOR flash is similar to reading from random-access memory, provided the address and data bus are mapped correctly. Because of this, most microprocessors can use NOR flash memory as execute in place (XIP) memory, meaning that programs stored in NOR flash can be executed directly without the need to copy them into RAM. NOR flash chips lack intrinsic bad block management, so when a flash block is worn out, the software or device driver controlling the device must handle this, or the device will cease to work reliably.

NROM short for nitride(d) read only memory. Generally, a FET-type device having a charge trapping medium such as a nitride layer for storing charges (electrons and holes) in two discrete areas, near the source and drain diffusions, respectively.

NVM short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and "memorize" that position.) NVM includes floating gate (FG) devices and NROM devices, as well a devices using optical, magnetic and phase change properties of materials.

ONO short for oxide-nitride-oxide. ONO is used as a charge storage insulator consisting of a sandwich of thermally insulating oxide, and charge-trapping nitride.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films may be obtained by thermal oxidation of silicon. Thermal SiO2 forms a smooth, low-defect interface with Si, and can be also readily deposited by CVD.

poly short for polycrystalline silicon (Si). Heavily doped poly Si is commonly used as a gate contact in silicon MOS and CMOS devices;

program a method to program a bit in an array, by applying a voltage scheme that injects electrons. This method causes an increase in the Vt of the bit that is being programmed. Alternatively, with "high Vt erase", programming may be a lowering of the Vt of the memory cell. See erase and read. Program may sometimes, erroneously be referred to as "write". See write.

read a method to read the digital data stored in the array. The read operation is usually performed in "blocks" of several cells. See erase and program.

ROM short for read-only memory.

SA short for sense amplifier (or "sense amp"). A sense amplifier is generally used in conjunction with memory arrays to amplify a voltage coming off of a bit line. There are many versions of sense amplifiers used in memory chips.

sector a part of the array, usually larger than a page, which usually contains a few pages. A minimum erase might include a sector. For example:
Erase Sector (ES): Group of cells that are erased by single erase command
Physical Sector (PS): Group of ES connected by single grid of Word Lines (WL) and Bit Lines (BL), sharing same set of drivers.

SLC short for single level cell. In the context of a floating gate (FG) memory cell, SLC means that one bit of information can be stored in the memory cell. In the context of an NROM memory cell, SLC means that at least two bits of information can be stored in the memory cell.

slice a portion of a memory array, such as a group of bitlines, that are connected to one sense amplifier (sense amp, "SA")

virtual ground array a topological architecture of memory cells where there is an electrical connection between neighboring cells.

V short for voltage. Different voltages may be applied to different parts of a transistor or memory cell to control its operation word line or wordline, (WL). A conductor normally connected to the gate of a memory cell transistor. The wordline may serve as the gate electrode of several memory cells.

write a combined method usually involving first erasing a large set of bits, then programming new data into the bit set; the erase step is not required but it is customary. See erase and program.

In addition to the above, some abbreviations or terminology that may be used herein, or in a provisional application (if any) from which this non-provisional application claims priority, may include:

add short for address
bot short for bottom
BS short for byte select
cmi representative of a voltage indicative of the current coming out of a cell being read CS short for chunk select. Also referred to as column select
DBL short for diffusion bit line. May also refer to local bitline (LBL)
FC short for flash cell
GBL short for global bit line. May also refer to metal bitline (MBL).
Icell short for current going through a cell
LBL short for local bit line. May also refer to diffusion bitline (DBL).
MBL short for metal bit line. May also refer to global bitline (GBL).
sl, sel short for select
Vdr short for drain voltage
Vdr_ave short for average drain voltage
Vtn short for NMOS threshold voltage

BRIEF DESCRIPTION (SUMMARY)

According to some embodiments of the present invention, there is provided a method of reading one or more non-volatile memory ("NVM") cells in an NVM array, including pre-charging or discharging one or more bitlines which are not directly connected to said one or more NVM cells being read. Reading of the one or more NVM cells may be performed in an order which keeps a sensing node of the cells being read facing a bitline which has been pre-charged or discharged. Pre-charging or discharging of bitlines may include pre-charging or discharging several global bitlines and local bitlines. The pre-charged or discharged global bit lines may be selected according to a pre-defined table per each cell address. Selection of global bitlines may be done according to whether these global bitlines will interfere with sensing during the next read cycle.

According to further embodiments of the present invention, there may be provided a method of reading a plurality of non-volatile memory (NVM) cells which are arranged in a row of memory cells and which are selectively connected to a first bitline and a second bitline comprising reading a first memory cell in the row, skipping the second adjacent cell, and reading a third memory cell in the row, keeping charged or keeping discharged bitlines of the memory cell which was previously read. A sequence for reading additional memory cells in the same row may skip adjacent cells to cells that were read and may keep charged or discharged bitlines of those memory cells that were read. The sequence may be repeated, reading one or more memory cells that were previously skipped by skipping one or more memory cells that were previously read.

According to some embodiments of the present invention, there may be provided a method of reading a plurality of non-volatile memory (NVM) cells which are arranged in a row of memory cells and which are selectively connected to a first bitline and a second bitline, the method including using a read order such that a charged or discharged state remains on the drain-side or on the source-side of the cells. The method may include keeping charged or keeping discharged drain-side or source-side diffusion bitlines of memory cells which were previously read.

According to further embodiments of the present invention, there may be provided a method of reading a plurality of non-volatile memory (NVM) cells which are arranged in a row of memory cells, by using one of the cell's two diffusion bitlines as a sensing node and performing read in an order which keeps a sensing node facing a bitline which was pre-charged or discharged. The pre-charged or discharged bitlines may be selected so as to mitigate pipe effect during a next read cycle.

According to some embodiments of the present invention, there may be provided a non-volatile memory ("NVM") device including NVM cells in an NVM array and control logic adapted to cause a circuit to pre-charge or discharge one or more bitlines not directly connected with the one or more NVM cells. The control logic may be adapted to cause the reading of the one or more NVM cells to occur in an order which keeps a sensing node of the cells being read facing a bitline which has been pre-charged or discharged. Pre-charging or discharging comprises pre-charging or discharging several global bitlines and local bitlines. Pre-charged or discharged global bit lines may be selected according to a pre-defined table per each address. Selection of the global bitlines may be done according to whether these global bitlines will interfere with sensing during the next read cycle.

According to further embodiments of the present invention, a non-volatile memory ("NVM") device may include a plurality of non-volatile memory (NVM) cells which are arranged in a row of memory cells and which are selectively connected to a first bitline and a second bitline comprising. The device may include control logic adapted to apply a cell read order that causes a charged or discharged state to remain on the drain-side or source-side of the cells. The control logic may be adapted to cause switching circuitry to keep charged or keep discharged drain-side or source-side diffusion bitlines of memory cells which were previously read.

An object of the disclosure is to provide an improved sensing technique for non-volatile memory cells, such as (but not limited to) NROM cells.

Generally, memory cells arranged in a NAND architecture will be discussed. Generally, a number of memory cells are connected to a common wordline (WL), and a given memory cell may be formed between two diffusion bitlines (DBLs) which are connected by select (SEL) transistors to respective top and bottom metal bitlines (MBLs).

Memory cells may be referred to as flash cells (FCs). Diffusion bitlines (DBLs) may be referred to as local bitlines (LBLs). Metal bitlines (MBLs) may be referred to as global bitlines (GBL).

During sensing (reading the contents of a memory cell), there may be a "pipe effect" created by conductive elements (such as adjacent or neighboring FCs, DBLs, MBLs) which are connected to the memory cell (FC) being sensed, acting as capacitors and draining current. This can significantly reduce the accuracy of a sensing scheme, and may be particularly troublesome with multi-level cell (MLC) sensing schemes where the different program levels tend to be very closely spaced.

According to the disclosure, generally, a dynamic pre-charge sequence (method) may significantly reduce pipe current and/or neighbor current. The method may also include a dedicated read order of the flash cells, which will result in keeping the sensing node facing the section of the pipe which was pre-charged.

The method may include pre-charging (or discharging) several metal bit lines (MBLs) and diffusion bitlines (DBLs) substantially to the bitline read voltage ($V_{BLR}$, or Vdr). The pre-charged MBLs may be selected according to a pre-defined table per each address. The selection of the MBLs may also be done according to whether these MBLs will interfere with the pipe during the next read cycle. Alternatively, the pre-charge can be to a higher level than required, and then discharged to the "required" voltage.

Generally, by pre-charging (or pre-discharging) the pipe to a controlled level, the pipe (neighbor) current is significantly reduced and, thus, the sensing current is almost equal to the flash cell current, which is what a good sensing scheme tries to achieve.

The techniques disclosed herein can be applied for both drain-side and source-side sensing schemes. In the main hereinafter, drain-side sensing (or simply "drain sensing") schemes are discussed.

The pipe effect can significantly degrade flash performance. A method to significantly reduce pipe current and/or neighbor current using a pre-charge sequence is disclosed. A dedicated read order keeps the sensing node facing the section of the pipe which was pre-charged. The technique involves pre-charging several global bitlines (such as metal bitlines, or MBLs) and local bitlines (such as diffusion bitlines, or DBLs). The pre-charged global bitlines may be selected according to a pre-defined table per each address. The selection of the global bitlines may be done according to whether these global bitlines will interfere with the pipe during the next read cycle.

By using the techniques disclosed herein, the pipe is pre-conditioned, and performance degradation is minimized (lessened), resulting in better overall performance of the memory array.

According to an embodiment of the disclosure, a method to reduce pipe current when reading an array of flash cells comprises: using a dynamic pre-charge sequence. Reading may be performed in an order which keeps a sensing node of the cells being read facing a portion of the pipe which has been pre-charged.

According to an aspect of the disclosure, pre-charging may comprise pre-charging several global bitlines and local bitlines. The pre-charged global bit lines may be selected according to a pre-defined table per each address. The selection of the global bitlines may be done according to whether these global bitlines will interfere with the pipe during the next read cycle.

According to an embodiment of the disclosure, a method of reading a plurality of non-volatile memory (NVM) cells which are arranged in a row of memory cells and which are selectively connected to a first metal bitline (MBL-0) and a second metal bitline (MBL-1) comprises: reading a first memory cell, skipping the next, reading the next, skipping the next, and repeating this pattern, starting at one end of the row and terminating at an opposite end of the row. Read-side diffusion bitlines of memory cells which were previously read may be kept charged.

According to an embodiment of the disclosure, a method of reading a plurality of non-volatile memory (NVM) cells which are arranged in a row of memory cells and which are selectively connected to a first metal bitline (MBL-0) and a second metal bitline (MBL-1) comprises: organizing a read order so that a charge remains on the read-side of the cells. The memory cells may be selectively connected to the metal bitlines by select transistors (Mn) and respective diffusion bitlines (DBL-n). Read-side diffusion bitlines of memory cells which were previously read may be kept charged.

According to an embodiment of the disclosure, a method of reading a plurality of non-volatile memory (NVM) cells which are arranged in a row of memory cells, using one of the cell's two diffusions as a sensing node, comprises: performing read in an order which will result in keeping the sensing node facing the section of the pipe which was pre-charged. Global bitlines and local bitlines may be pre-charged. The pre-charged global bitlines may be selected according to a pre-defined table per each address. The pre-charged global bitlines may be selected so as to minimize pipe effect during a next read cycle.

According to an embodiment of the disclosure, a method of sequentially reading a slice of flash cells, one side of the slice constituting a pipe, comprises: starting read at one end of the slice, and changing the address, such that the pipe will not be discharged. A sensing node side may be kept facing the same direction so that the metal bitlines associated with the cells being read do not change state. Whenever a significant amount of capacitance is added to the pipe side, a pre-charge pulse may be asserted in order to minimize the pipe effect. If a first required read address is located somewhere other than at the end of the slice, the pipe may first be pre-charged then, after the pipe is pre-charged, the read address may be selected.

Advantages of the techniques disclosed herein may include:

reduced pipe effect more accurate sensing

The techniques disclosed herein may be applicable to most NVM devices including, but not limited to, charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANDS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and also to Floating Gate (FG) devices.

BRIEF DESCRIPTION OF THE DRAWING(S)

Reference will be made in detail to embodiments of the disclosure, examples of which may be illustrated in the accompanying drawing figures (FIGS). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures, will become apparent throughout the specification, including, if applicable, in the claims and abstract.

Throughout the descriptions set forth in this disclosure, lowercase numbers or letters may be used, instead of subscripts. For example Vg could be written $V_g$. Generally, lowercase is preferred to maintain uniform font size.) Regarding the use of subscripts (in the drawings, as well as throughout the text of this document), sometimes a character (letter or numeral) is written as a subscript-smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "Vs" and "H2O".

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and where there is a dot at the intersection of the two lines are connected with one another, else (if there is no dot at the intersection) they are typically not connected with one another.

DETAILED DESCRIPTION

Figure 1:
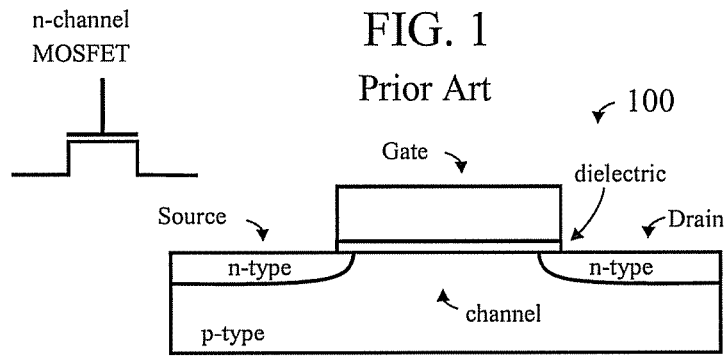
FIG. 1 is a stylized cross-sectional view of a field effect transistor (FET), according to the prior art. To the left of the figure is a schematic symbol for the FET.
Figure 2:
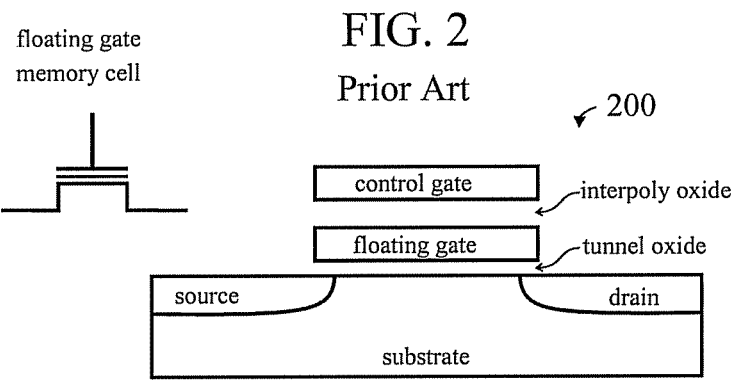
FIG. 2 is a stylized cross-sectional view of a floating gate memory cell, according to the prior art. To the left of the figure is a schematic symbol for the floating gate memory cell.

In the following description, various aspects of techniques for reading of NVM cells/arrays will be described. For the purpose of explanation, specific configurations and details are set forth in order to provide a thorough understanding of the techniques. However, it will also be apparent to one skilled in the art that the techniques may be practiced without specific details being presented herein. Furthermore, well-known features may be omitted or simplified in order not to obscure the description(s) of the techniques.

Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Furthermore, it should be understood that the disclosure can be carried out or practiced in various ways, and that the disclosure can be implemented in embodiments other than the exemplary ones described herein below. The descriptions, examples, methods and materials presented in this specification, as well as in the claims, should not be construed as limiting, but rather as illustrative.

The disclosure is directed to a sensing technique for reading NVM (non-volatile memory), particularly FCs (flash cells). The sensing mechanism includes a pre-charge phase, integrated with a dedicated read order to reduce pipe effect (neighbor current) and provide more accurate sensing, particularly of multi-level cell flash memory. The technique may also be useful for single-level flash memory cells.

Generally, before a new read cycle starts, or whenever MBL drain is changed, a pre-charge operation (phase) may be done. Alternatively, first all of the MBLs are in a charged condition, then discharged. These two (charging from zero up to a voltage, or discharging down to the voltage) should be considered to be interchangeable, for purposes of this disclosure and, in either case, the pre-charge phase may be performed before there is a change in MBL voltage which otherwise would lead to parasitic capacitance.

As explained in greater detail hereinbelow, for each address that requires the pre-charge phase, the relevant metal bitlines (MBLs) may be pre-charged to substantially the VBLR (bitline read voltage) level for the memory cell which will be read. The selection of which MBLs to pre-charge per address is based on the slice architecture and may be controlled by software (SW). (Generally, a "slice" may be a plurality of memory cells associated with one sense amplifier (SA).) Select transistors are turned on, charging the associated diffusion bitlines (DBLs) through the MBLs. Generally, by pre-charging appropriate MBLs, the effects of parasitic capacitance (pipe effect) can be minimized, thereby increasing read accuracy. DBLs can be selected/controlled based on slice architecture by software as well as MBLs.

After the pre-charge phase, the MBLs and DBLs may be kept floating, and the charge stored on them blocks the pipe current during the active read cycle.

A dedicated read order may be chosen to minimize the necessity for the pre-charge phase and minimize the pipe effect. As explained in greater detail hereinbelow, by observing the dedicated read order, the need to pre-charge before reading may be avoided, thereby eliminating some steps. For example, by reading every other cell, from left-to-right (such as FC-1, FC-3, FC-5, FC-7 . . . ), a pre-charge may only be required for the initial read of FC-1, as described in greater detail hereinbelow.

An Exemplary Solution

An exemplary solution to the pipe effect problem, in the case of drain-side sensing, may comprise the following steps, set forth first in outline form:

1. Pre-Charging the Pipe Prior to the Read Cycle:
  a. Pipe address/configuration is selected
  b. Pre-charge pulse is asserted
   Pre-charging most of the DBLs and all or some of the MBLs which would be affecting the pipe on the drain side of the FC being read, during the coming read cycle
  c. Address changes to read address
 2. Read Cycle
  a. Pre-charge stopped, and the drain side is supplied by a controlled voltage (through the drain driver)
   Icell stabilization phase
  b. after allowing for stabilization, sensing starts For source-side sensing, the same steps would be followed, but on the source side, rather than the drain side. Either node (source or drain) may be used for sensing. In the main, hereinafter, drain-side sensing is discussed.

Two main cases of operation will be discussed:

a. sequential read cycles

Start read at one end of an "isolated" slice, and change the address such that the pipe will not be discharged. (An "isolated" slice is a slice that has no neighbors/pipe at the drain side.)

This may be achieved by keeping the drain side facing the same direction, so that the MBLs don't change state (for example don't switch their functionality between drain or source)

Whenever a significant amount of capacitance is added to the pipe side (for example: MBL change), a pre-charge pulse is asserted in order to minimize the pipe effect.

b. one read cycle

If the first required read address is located somewhere in the middle (other than at the end) of the slice, then the pipe is being pre-charged first, and only afterwards the read address is selected as described above An Exemplary Sequential Read Cycle An exemplary sequential read cycle (or sequence) will now be discussed. Generally, this sequence starts from an isolated end of a slice.

The exemplary read cycle sequence is presented in the following Table ("Table 1. Sequential Read Cycle"), and is illustrated with respect to FIGS. 5-13. Table 1 summarizes an example of a decoding configuration during pre-charge and read cycle phases. The example is for a sequential read starting from the left isolated end of the slice->address 0 to address 7.

Table 1 describes the state of the select transistors and MBLs and DBLs during the read cycle, and defines the state of the select and MBLs during the read cycle pre-pulse address phase used for pre-charge (or discharge).

Generally, each row of Table 1, from top down, represents a step in the sequential read cycle. Each of the rows will now be described, generally. What is happening at each step, more particularly with respect to the eight rows labeled logic add 0 through 7, is illustrated in (and described in greater detail with respect to) FIGS. 5-13.

As mentioned above, with Vdr on the drain (D), the program level (Vt) stored over the source (S) may be sensed. Generally, to sense the Vt, current is measured, such as the current flowing into the drain (D) or the current coming out of the source (S). Either the drain (D) or the source (S) may be used as the "sensing node".

Figure 5:
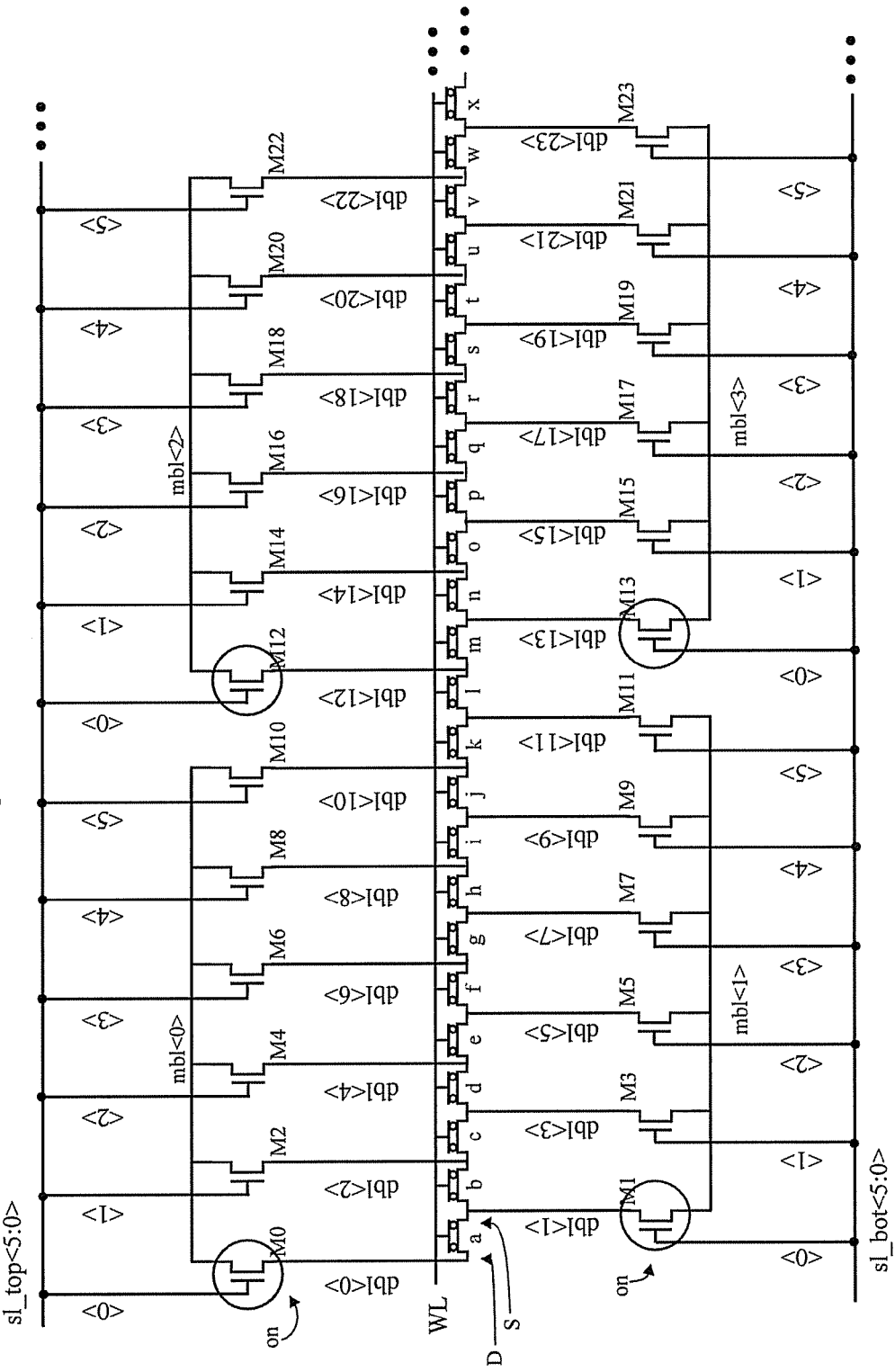
FIGS. 5-13 are schematic illustrations of a row (or slice) of memory cells, illustrating an embodiment of a method of reading the memory cells, according to the disclosure.

Table 1 accounts for a number of FCs #0-#14 (compare FCs a-o; FIG. 5) connected to a common wordline, and illustrates that:

logical address "0" is associated with FC-0 ("a" in FIG. 5), logical address "1" is associated with FC-2 ("c" in FIG. 5), logical address "2" is associated with FC-4 ("e" in FIG. 5), and so forth.

Generally, as the logical address increments by one (+1), the physical address increments by two (+2), skipping every other FC, to maintain a sequence of drain-side sensing.

For source-side sensing, a similar scheme of skipping every other FC can be implemented, based on the teachings presented herein, such as for memory cells FC-1 ("b" in FIG. 5), FC-3 ("d" in FIG. 5), FC-5 ("f" in FIG. 5), and so forth.

TABLE 1

| | | | Sequential Read Cycle | | | | | |
|---|---|---|---|---|---|---|---|---|
| | Add | | | | | | | |
| logic | Cell | | SL | | DBL | | MBL | |
| add | letter | FC# | t | b | D | S | D | S |
| | | | — | all | | | all discharged | |
| 0 | a | 0 | 0 | 0 | 0 | 1 | 0 | 1 |
| 1 | c | 2 | 0, 1 | 1 | 2 | 3 | 0 | 1 |
| 2 | e | 4 | 0, 1, 2 | 2 | 4 | 5 | 0 | 1 |
| 3 | g | 6 | 0, 1, 2, 3 | 3 | 6 | 7 | 0 | 1 |
| 4 | i | 8 | 0, 1, 2, 3, 4 | 4 | 8 | 9 | 0 | 1 |
| 5 | k | 10 | 0, 1, 2, 3, 4, 5 | 5 | 10 | 11 | 0 | 1 |
| | | | 0, 1, 2, 3, 4, 5 | 1, 2, 3, 4, 5 | | | Pre-charge 0, 1 | |
| 6 | m | 12 | 0 | 0 | 12 | 13 | 2 | 3 |
| 7 | o | 14 | 0, 1 | 1 | 14 | 15 | 2 | 3 |

Table 1 will now be discussed, briefly, row-by-row, cross-referencing selected ones of FIGS. 5-13.

The cycle starts with discharge of all the slice. All of the MBLs are discharged. The read will start from the isolated end of the slice, or "wall", to the left of dbl<0>.

The first address (Logical Address 0, FC#0, memory cell "a") is such that the dbl drain (0) is facing the isolated end of the slice. Therefore, there is no pipe, and no pre-charge phase is necessary. See FIG. 5.

The second address (Logical Address 1, FC#2, memory cell "c") uses MBL-0 for drain read voltage (Vdr) and MBL-1 for source (grounded). The drain DBL is (2), since select bot (0) is "off" there is no problem using MBL-0 as source. See FIG. 6.

The same applies for Logical Addresses 2-5 (FC#4, FC#6, FC#8, FC#10) where the number of select top which are turned on is increased to help charging the DBLs during the read cycle itself, making the pre-charge phase optional. See FIGS. 7-10.

Then, a pre-charge step is performed, prior to reading Logical Address 6. See FIG. 11.

For reading Logical Address 6 (FC#12, cell "m" in FIG. 5), MBL-2 is used as drain, and MBL-3 is used as source instead of MBL-1. Note that MBL-1 (which was grounded) would be connected to the pipe through the select bot 0, which is used during the coming read cycle. Therefore MBL-1 needs a pre-charge. A pre-charge pulse is sent to MBL-0 and MBL-1 and, using the top select transistors, the DBLs to the left of the next drain (DBL-12) are also charged. See FIG. 12.

The above setting maintains the pipe facing the drain (DBL-12) charged, and thus may significantly reduce the pipe effect.

Neglecting to do the above pre-charge flow would have allowed a large pipe effect to manifest itself, specifically because MBL-1 would be connected to the pipe, and because its capacitance is large and it is at ground level, and it would have discharged the pipe to some extent which would have created a parasitic pipe current affecting the read of Logical Address 6.

For reading Logical Address 7, (FC#14, cell "o" in FIG. 5), MBL-2 is used for the drain and MBL-3 is used for the source.

For reading Logical Address 8, (FC#16, cell "q" in FIG. 5), MBL-2 is used for the drain and MBL-3 is used for the source.

This scheme may continue, in the manner set forth above, until the right isolated end of the slice is reached. Flash cells which were "skipped" (FC#1, FC#3, FC#5 . . . ), in order to keep the drains facing one direction (left), may be read in a similar manner, as described hereinbelow. The alternative of using source-side sensing is also discussed below.

FIGS. 5-13 are schematic illustrations of a portion (which may be a "slice") of a memory array, illustrating an embodiment of the techniques disclosed herein. Generally, as used herein, a "slice" is a number of memory cells that are associated with one sense amp (SA).

Figure 3:
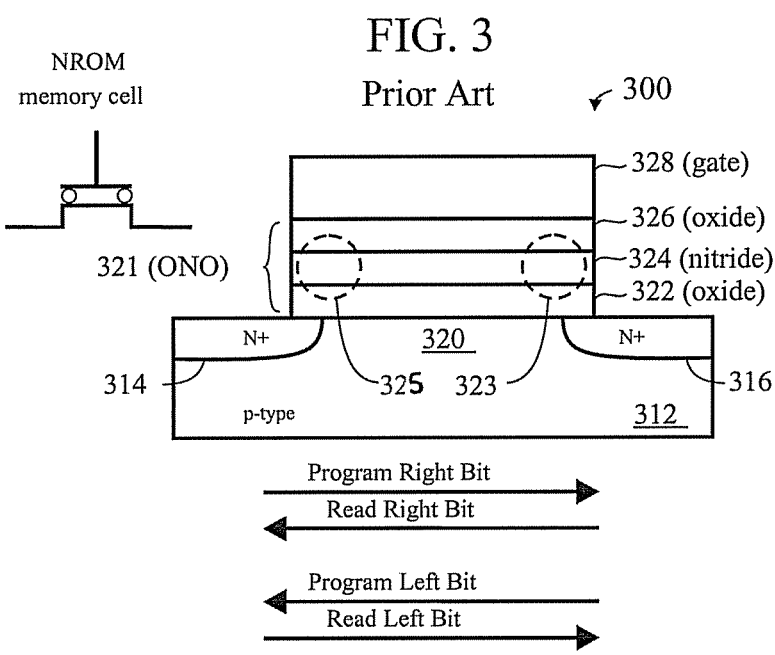
FIG. 3 is a stylized cross-sectional view of a two bit NROM memory cell of the prior art. To the left of the figure is a schematic symbol for the NROM memory cell.
Figure 4:
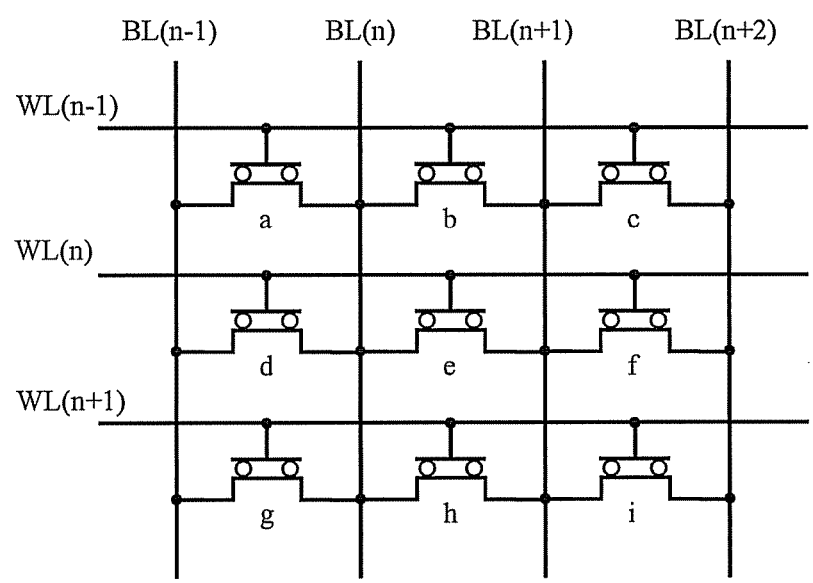
FIG. 4 is a diagram of a memory cell array with NROM memory cells, according to the prior art.

FIG. 5 illustrates a portion of a memory array, generally comprising a plurality (24 shown) of memory cells "a" through "l", and "m" through "x" having their gates connected to a common wordline WL (compare WLn, FIG. 4) The memory cells may be NROM cells, such as illustrated and described with respect to FIG. 3. Additional rows of memory cells (not shown) may be connected to other wordlines in the array (such as WLn−1 or WLn+1, FIG. 4). The memory cells are suitably "flash" memory cells, which may be abbreviated "FC", for "flash cell".

The wordline(s) may generally extend in the "X" direction, horizontally across the array, and the bitlines (described hereinbelow) may generally extend in the "Y" direction, vertically across the array.

For illustrative purposes, the memory cells may be arranged in the following manner. Memory cell b is to the right of memory cell a, memory cell c is to the right of memory cell b, memory cell d is to the right of memory cell c, memory cell e is to the right of memory cell d, memory cell f is to the right of memory cell e, memory cell g is to the right of memory cell f, memory cell h is to the right of memory cell g, continuing (alphabetically, in this manner) to memory cell x is to the right of memory cell w, as illustrated. It should be noted that:
   memory cells a, c, e, g, i, k comprise a group of (six) memory cells,
   memory cells b, d, f, h, j, l comprise a group of (six) memory cells,
   memory cells m, o, q, s, u, w comprise a group of (six) memory cells,
   memory cells n, p, r, t, v, x comprise a group of (six) memory cells, The purpose of these groupings of memory cells will become apparent in light of the following description. The number of memory cells in a group is at least 2.

Each memory cell has a right side diffusion and a left side diffusion, and a memory cell is generally symmetrical, left-to-right. Depending on how the memory cell is being operated, the right side diffusion may operate as a source (S) or drain (D), and the left side diffusion may serve as the drain (D) or source (S). For example, in the case of an NROM cell, to read the right bit of the cell,
   the right diffusion, acting as a source, may be set to 0 volts (ground)
   the left diffusion, acting as a drain, may be set to approximately +2 volts (such as +1.4 v)
   the gate (Vg) may be set to approximately +5 volts
   the substrate (Vb) may be set to 0 volts (or ground)
   and to read the left bit of the cell,
   the left diffusion, acting as a source, may be set to 0 volts (ground)
   the right diffusion, acting as a drain, may be set to approximately +2 volts
   the gate (Vg) may be set to approximately +5 volts
   the substrate (Vb) may be set to 0 volts (or ground)

The memory cells may be physically arranged so that they share diffusions. For example, the right side diffusion of the memory cell "a" may also be the left side diffusion of the memory cell "b", the right side diffusion of the memory cell "b" may also be the left side diffusion of the memory cell "c", and the right side diffusion of the memory cell "c" may also be the left side diffusion of the memory cell "d", and so forth (as shown), and the right side diffusion of the memory cell "w" may also be the left side diffusion of the memory cell "x", as illustrated.

A plurality of diffusion bitlines (DBLs) are illustrated. The diffusion bit lines may comprise the source/drain diffusions of the memory cells, as well as other rows of memory cells. Twenty four diffusion bitlines (DBLs) are shown, and are numbered from "0" to "23". In the drawing, a given diffusion bitline DBL<n> may be referred to in the text as DBL-n (using a dash "-" instead of angle brackets "< >"), where "n" is a number between 0 and 23. The diffusion bitlines may be arranged, as follows:
   a diffusion bit line (DBL-0) extends to the left side diffusion of the memory cell "a";
   a diffusion bit line (DBL-1) extends to the right side diffusion of the memory cell "a", which may also be the left side diffusion of the memory cell "b";
   a diffusion bit line (DBL-2) extends to the left side diffusion of the memory cell "c", which may also be the right side diffusion of the memory cell "b";
   and so forth (as shown), until
   a diffusion bitline (DBL-23) extends to the right side diffusion of the memory cell "w", which may also be the left side diffusion of the memory cell "x", as illustrated.

A number of metal bitlines (MBLs) are illustrated. Four metal bitlines (MBLs) are shown, and are numbered from "0" to "3". In the drawing, a given metal bitline mbl<n> may be referred to in the text as MBL-n (using a dash "-" instead of angle brackets "< >"), where "n" is a number between 0 and 3. Each diffusion bitline (DBL) may be connected, through a select transistor (Mn) to a metal bitline (MBL) as follows.
   diffusion bitlines DBL-0, DBL-2, DBL-4, DBL-6, DBL-8 and DBL-10, which comprise the left diffusions of memory cells a, c, e, g, i, and k are connected through corresponding select transistors M0, M2, M4, M6, M8 and M10 to metal bitline (MBL-0)
   diffusion bitlines DBL-1, DBL-3, DBL-5, DBL-7, DBL-9 and DBL-11, which comprise the left diffusions of memory cells b, d, f, h, j, and l are connected through corresponding select transistors M1, M3, M5, M7, M9 and M11 to metal bitline (MBL-1)
   diffusion bitlines DBL-12, DBL-14, DBL-16, DBL-18, DBL-20 and DBL-22, which comprise the left diffusions of memory cells m, o, q, s, u, and w are connected through corresponding select transistors M12, M14, M16, M18, M20 and M22 to metal bitline (MBL-3)
   diffusion bitlines DBL-13, DBL-15, DBL-17, DBL-19, DBL-21 and DBL-23, which comprise the left diffusions of memory cells n, p, r, t, v, and x are connected through corresponding select transistors M13, M15, M17, M19, M21 and M23 to metal bitline (MBL-3)
   In this example,
   six select transistors (M0, M2, M4, M6, M8, M10) are associated with six diffusion bitlines (DBL-0, DBL-2, DBL-4, DBL-6, DBL-8, DBL-10), with eleven memory cells (a, b, c, d, e, f, g, h, i, j, k), and with one metal bitline MBL-0. (The reason that there are only eleven, rather than twelve memory cells associated with MBL-0 is because this example is showing the left-hand side, or "isolated end" of the slice.)
   six select transistors (M1, M3, M5, M7, M9, M11) are associated with six diffusion bitlines (DBL-1, DBL-3, DBL-5, DBL-7, DBL-9, DBL-11), with twelve memory cells (a, b, c, d, e, f, g, h, i, j, k, l), and with one metal bitline MBL-1.

six select transistors (M12, M14, M16, M18, M20, M22) are associated with six diffusion bitlines (DBL-12, DBL-14, DBL-16, DBL-18, DBL-20, DBL-22), with twelve memory cells (l, m, n, o, p, q, r, s, t, u, v, w), and with one metal bitline MBL-3.

six select transistors (M13, M15, M17, M19, M21, M23) are associated with six diffusion bitlines (DBL-13, DBL-15, DBL-17, DBL-19, DBL-21, DBL-23), with twelve memory cells (m, n, o, p, q, r, s, t, u, v, w, x), and with one metal bitline MBL-4. (Here, in contrast with MBL-0, the slice is shown continuing onward beyond cell x, so there are twelve memory cells associated with MBL-3.)

Generally, when a select transistor (M) is turned "on" (or is "up"), a connection between the corresponding diffusion bitline (DBL) and the corresponding metal bitline (MBL) is made. Else, if the select transistor is not "on", the connection between the diffusion bitline (DBL) and the metal bitline (MBL) is not made (open, no connection, or "down"). The select transistors may be turned "on" under the control of (in response to) signals provided on two select buses (SBs). Two select buses are shown—a "top" select bus sl_top<5:0> which may be referred to in the text as SB-top, and a "bottom" select bus sl_bot<5:0> which may be referred to in the text as SB-bot. For example, the select transistors M0, M2, M4, M6, M8, and M10 may be selectively controlled (switched "on") by a signal from a select bus (SB-top). Note that these select transistors M0, M2, M4, M6, M8, and M10 may all be associated with the left side diffusions of alternate (every other) memory cell a, c, e, g . . . .

the select transistors M1, M3, M5, M7, M9, and M11 may be selectively controlled (switched "on" by a signal from a select bus (SB-bot). Note that these select transistors M1, M3, M5, M7, M9, and M11 may all be associated with the left side diffusion of alternate (every other) memory cells b, d, f, h . . . .

the select transistors M12, M14, M16, M18, M20, and M22 may be selectively controlled (switched "on") by a signal from a select bus (SB-top). Note that these select transistors M12, M14, M16, M18, M20, and M22 may all be associated with the left side diffusions of alternate (every other) memory cell m, o, q, s . . . .

the select transistors M13, M15, M17, M19, M21, and M23 may be selectively controlled (switched "on") by a signal from a select bus (SB-bot). Note that these select transistors M13, M15, M17, M19, M21, and M23 may all be associated with the left side diffusion of alternate (every other) memory cells n, p, r, t . . . .

The select buses (SBs) control which select transistors (Ms) are turned on, and when a select transistor (M) is turned on, a voltage which is on the metal bitline (MBL) to which the select transistor (M) is connected will be imposed upon the diffusion bitline (DBL) to which the transistor (M) is connected. Generally, in the description that follows, the voltage on the Metal Bitlines (MBLs)—which is supplied via external drivers, decoders and/or multiplexers (not shown)—will be either zero (or ground), approximately +2.0 volts (such as +1.4 volts), or floating (not connected).

Generally, a given select bus (SB-top or SB-bot) controls select transistors in groups of six (in this example), corresponding to the logical groupings of memory cells discussed above. (The terms "SB-top" and "sl_top" may be used interchangeably, and the terms "SB bot" and "sl_bot" may be used interchangeably, in the description that follows.) For example:

the select transistors M0 and M12 may be turned on in response to a signal sl_top<0> (or simply "<0>") from SB-top, the select transistors M2 and M14 may be turned on in response to a signal sl_top<1> (or simply "<1>") from SB-top, the select transistors M4 and M16 may be turned on in response to a signal sl_top<2> (or simply "<2>") from SB-top, the select transistors M6 and M18 may be turned on in response to a signal sl_top<3> (or simply "<3>") from SB-top, the select transistors M8 and M20 may be turned on in response to a signal sl_top<4> (or simply "<4>") from SB-top, the select transistors M10 and M22 may be turned on in response to a signal sl_top<5> (or simply "<5>") from SB-top, the select transistors M1 and M13 may be turned on in response to a signal sl_bot<0> (or simply "<0>") from SB-bot, the select transistors M3 and M15 may be turned on in response to a signal sl_bot<1> (or simply "<1>") from SB-bot, the select transistors M5 and M17 may be turned on in response to a signal sl_bot<2> (or simply "<2>") from SB-bot, the select transistors M7 and M19 may be turned on in response to a signal sl_bot<3> (or simply "<3>") from SB-bot, the select transistors M9 and M21 may be turned on in response to a signal sl_bot<4> (or simply "<4>") from SB-bot, the select transistors M11 and M23 may be turned on in response to a signal sl_bot<5> (or simply "<5>") from SB-bot, Generally, in a given cycle of six signals, the signals <1> follow the signals <0>, the signals <2> follow the signals <1>, the signals <3> follow the signals <2>, the signals <4> follow the signals <3>, and the signals <5> follow the signals <4>. For example, the overall cycle may be approximately 1.5 μs (microseconds), and each individual signal may last for approximately one-sixth of a cycle, or approximately 250 ns (nanoseconds).

It should be understood that the choice of six cells in the read sequences is arbitrary, the number should be at least two, and can be as high as desired. However, for larger numbers of cells, the delay imposed in reading may be undesirable.

Generally, the signals <0> from both SB-top and SB-bot may occur simultaneously with one another, the signals <1> from both SB-top and SB-bot may occur simultaneously with one another, the signals <2> from both SB-top and SB-bot may occur simultaneously with one another, the signals <3> from both SB-top and SB-bot may occur simultaneously with one another, the signals <4> from both SB-top and SB-bot may occur simultaneously with one another, and the signals <5> from both SB-top and SB-bot may occur simultaneously with one another. This is but one of many optional combinations. Compare, for example, Table 1. Also, there may be cases where bot<1> and top<1> may not be active together. The invention is not limited to the combinations which are shown and described.

Note that FIG. 5 illustrates a plurality of memory cells comprising a left hand portion of a slice, which may comprise additional memory cells extending to the right. In the drawing, some lines are followed by three dots ( . . . ) to the right, indicating that they may continue onward. For example, the top select bus SL-top <5:0> may continue, to the right there may be more metal bitlines, such as MBL-4 and MBL-5 (not shown), each associated with select transistors, diffusion bitlines and memory cells the wordline may continue, to the right there may be additional memory cells, to the right of cell "x"

the bottom select bus SL-bot <5:0> may continue, to the right

Note also that in FIG. 5, there are circles around M0 and M1, and arrows (with legends "D" and "S") pointing to the left and right diffusions of memory cell "a". These are discussed below.

FIGS. 5-13, Illustrating the Sequential Read Cycle

In the following description of a technique for pre-charging metal bitlines in conjunction with reading the contents of memory cells, generally the left side diffusions of the memory cells being read are operated as drain (D), such as with a voltage of approximately +2V (such as +1.4 volts), and the right side diffusions of the memory cells being read are operated as source (S), such as with a voltage of 0V (or ground), such as for reading the contents of the right bit storage areas of the memory cells. It should be noted that the right side associated with source and left side associated with drain applies only to reading the cells from left to right, but at some point the read sequence will continue to read the "second" bits, and then the sides will flip.

Various signals and states associated with the technique illustrated and described with respect to FIGS. 5-13 are presented and/or tabulated in Table 1 (above) and in Table 2 (below).

Various voltages may selectively be applied to the various metal bitlines (MBL-0, MBL-1, MBL-2, MBL-3), as follows:

0 volts, or ground, which means that the MBL is grounded.

Vdr, which means that the appropriate read voltage (such as approximately +2 volts) is applied to the MBL, either to pre-charge it to Vdr, or in the process of reading a given memory cell. Also referred to as bitline read voltage ($V_{BLR}$).

"float", which means that no voltage is applied to the MBL. A given MBL may be permitted to float "with charge" (after having previously been charged, before it has an opportunity to discharge), or "without charge" (which is generally a "don't care" situation where the MBL may be retaining a previous charge or previously has been discharged).

TABLE 2

Voltage Levels on Metal Bitlines

Figure 6:
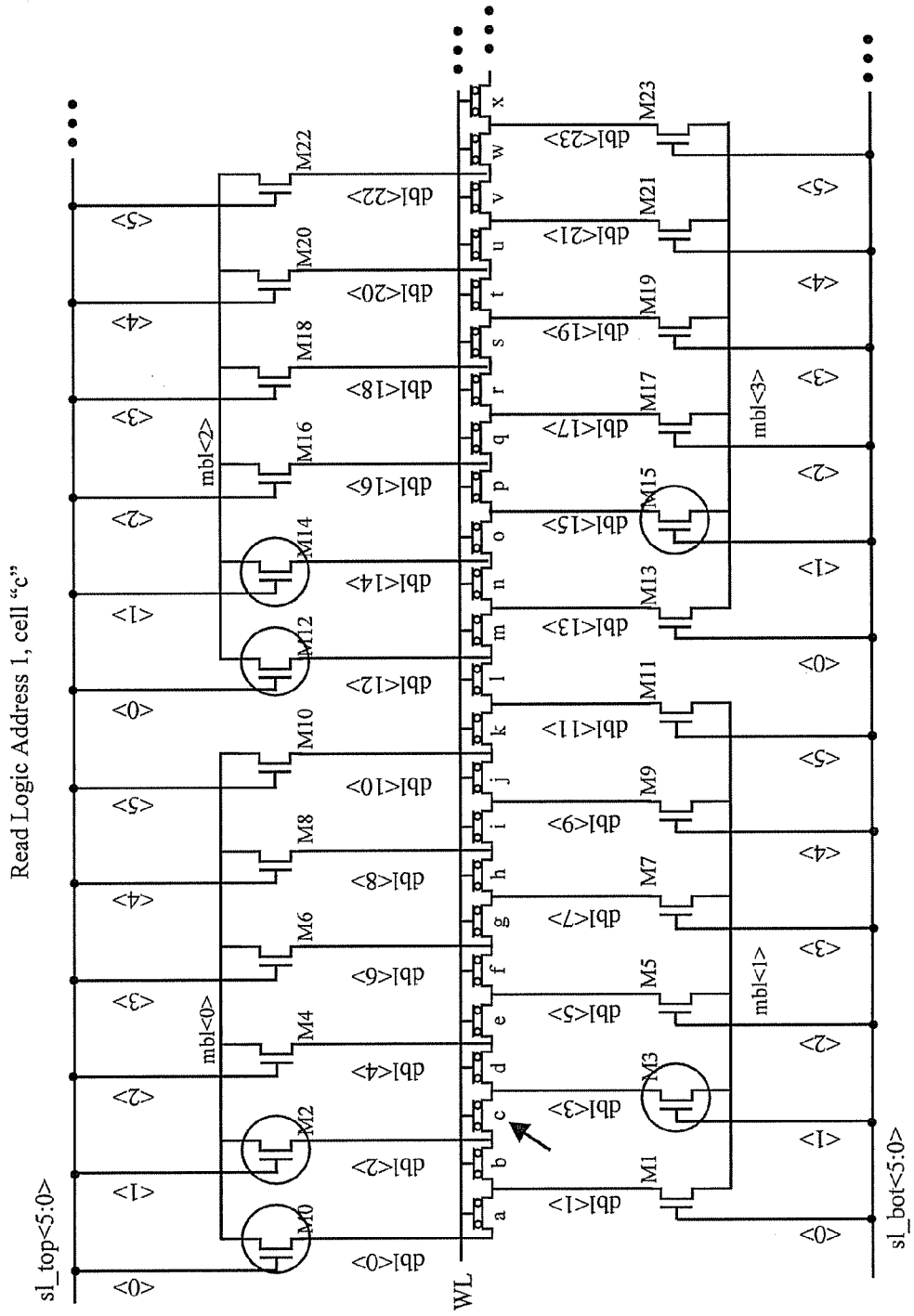
Figure 7:
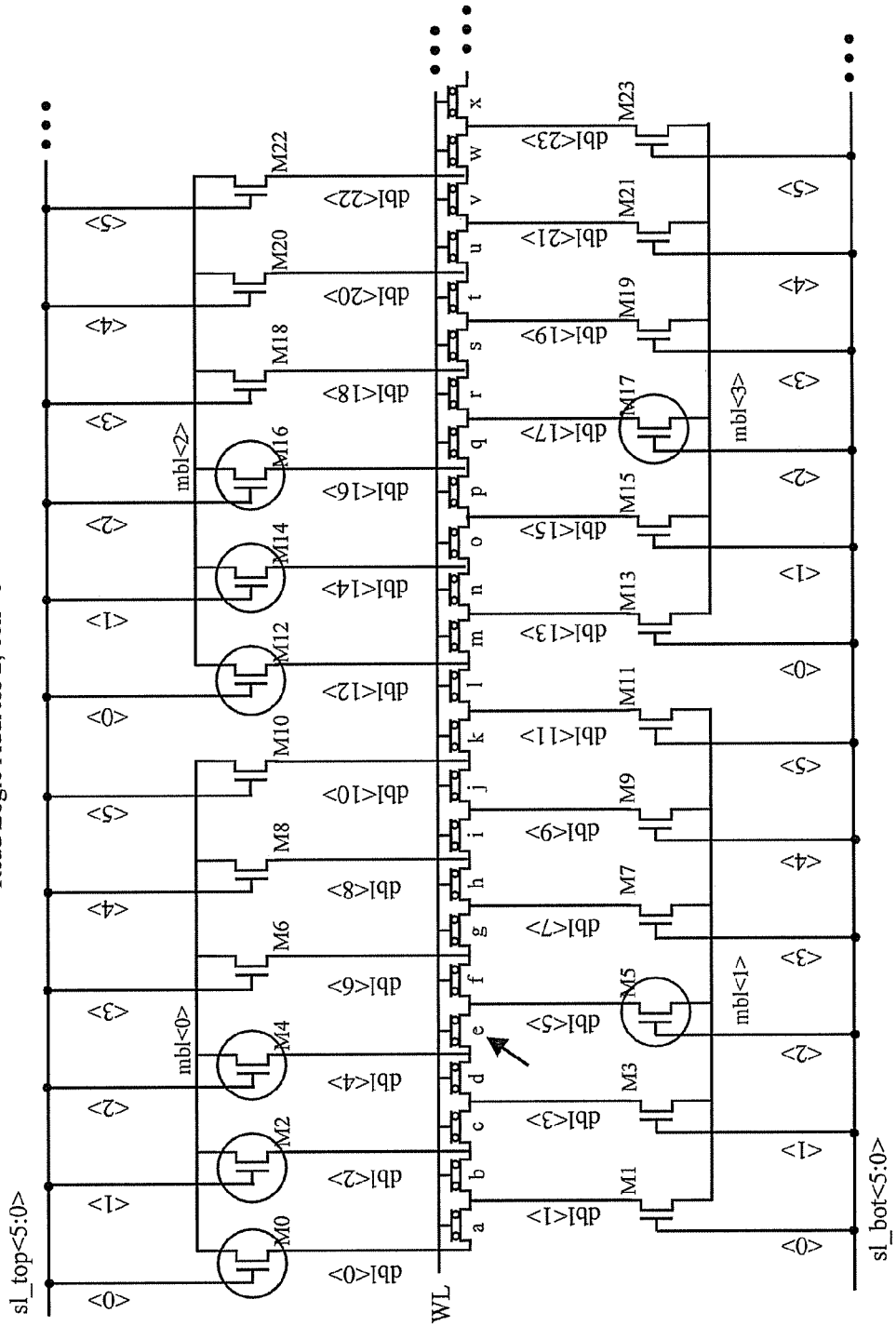
Figure 8:
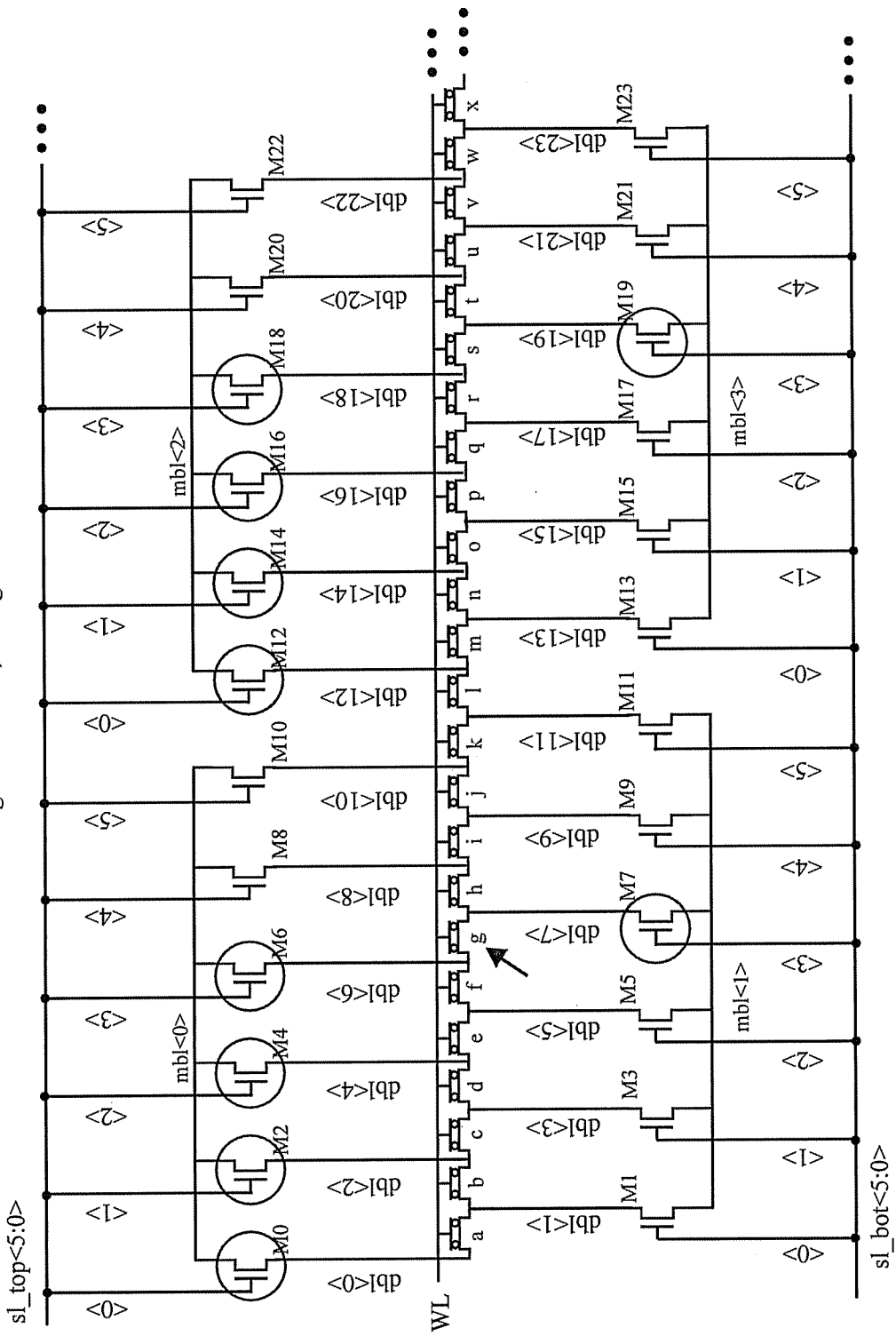
Figure 9:
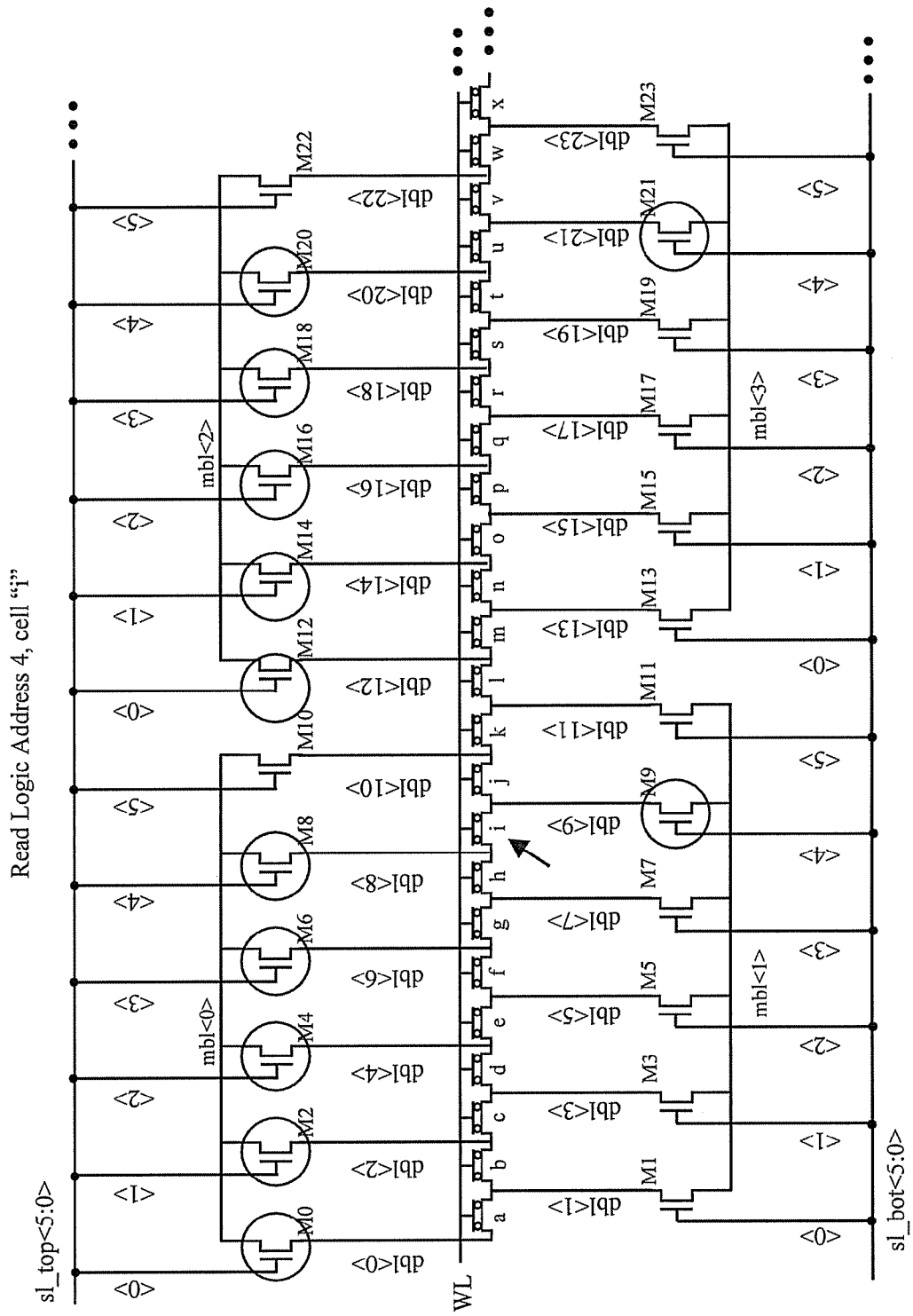
Figure 10:
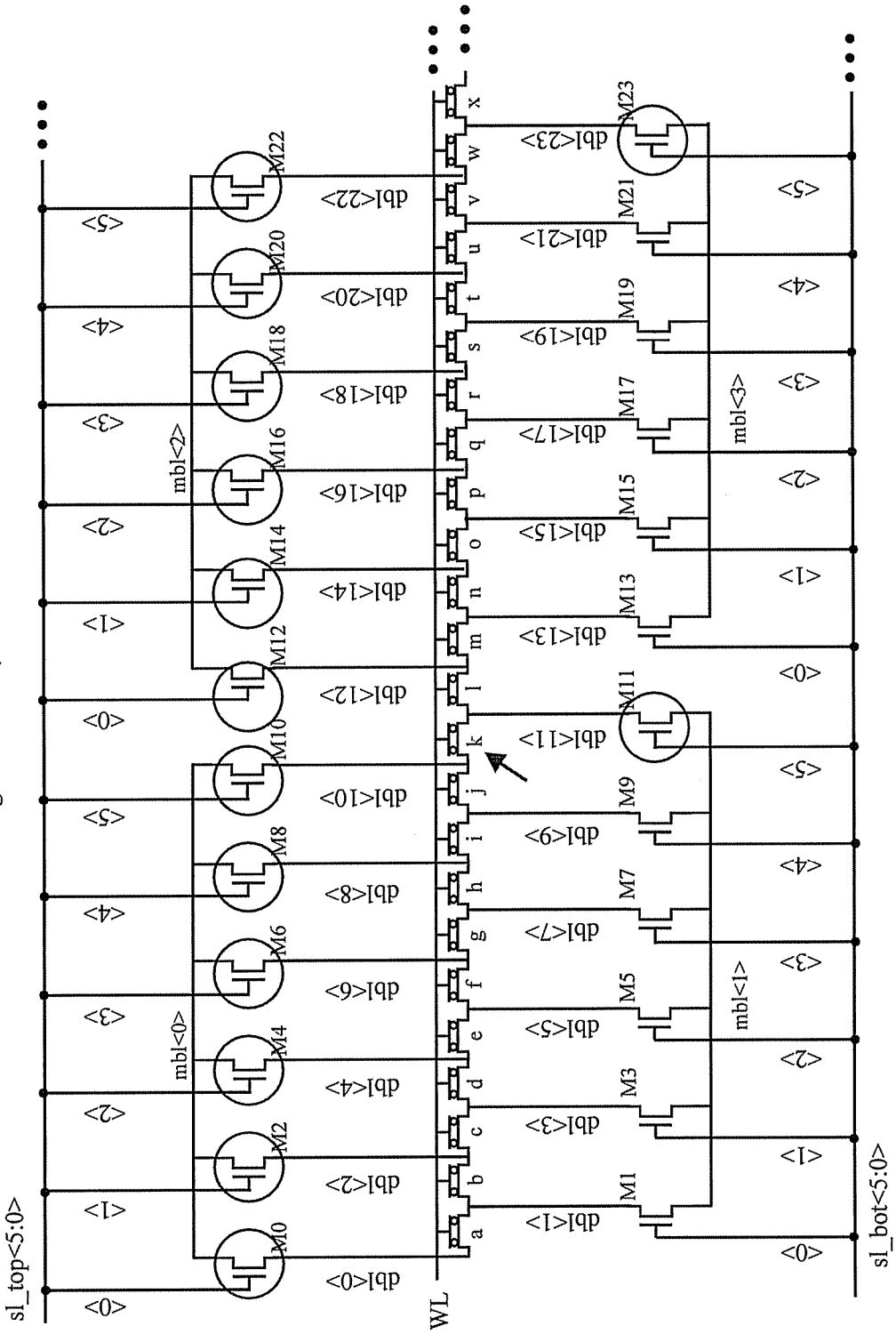
Figure 11:
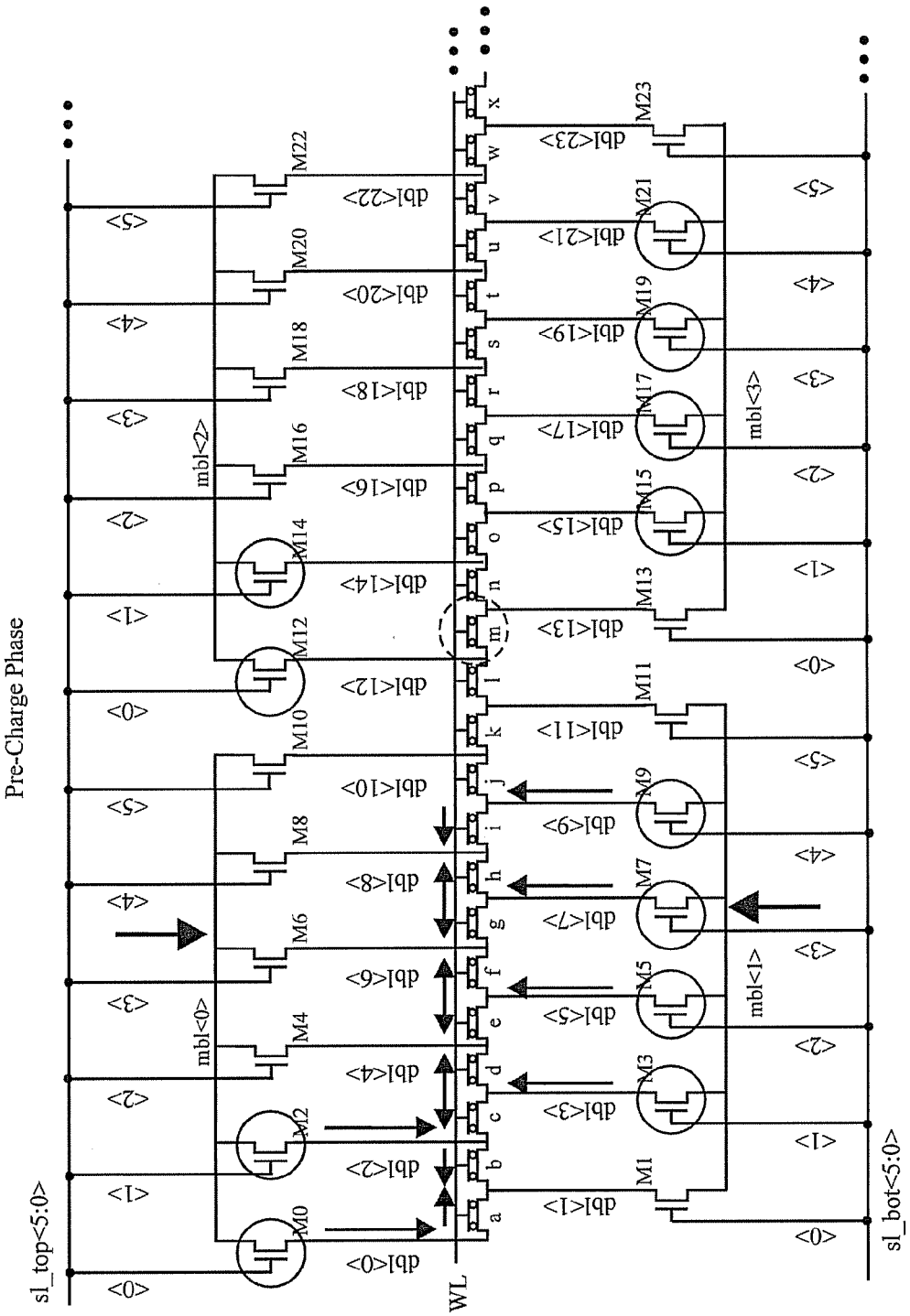
Figure 12:
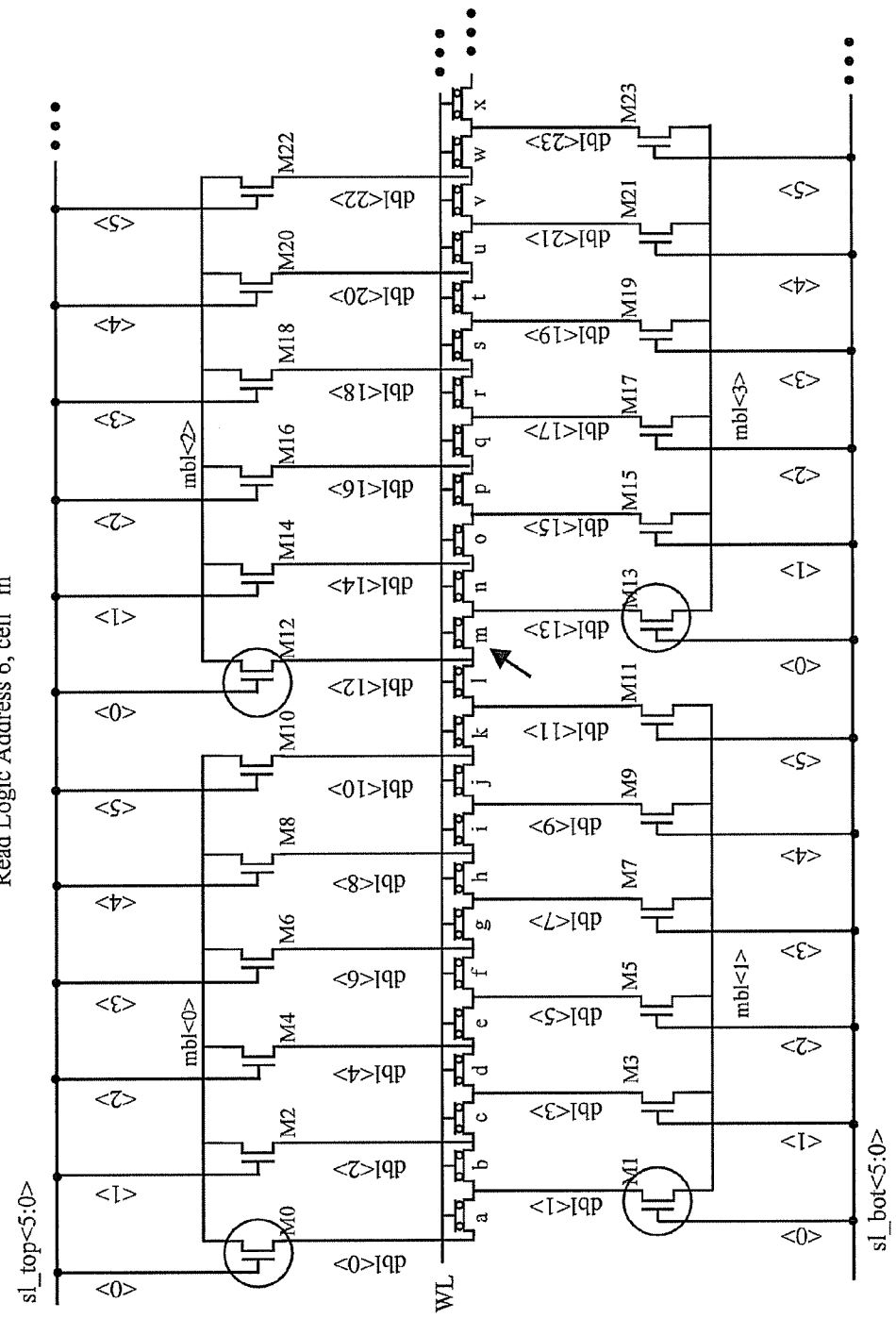
Figure 13:
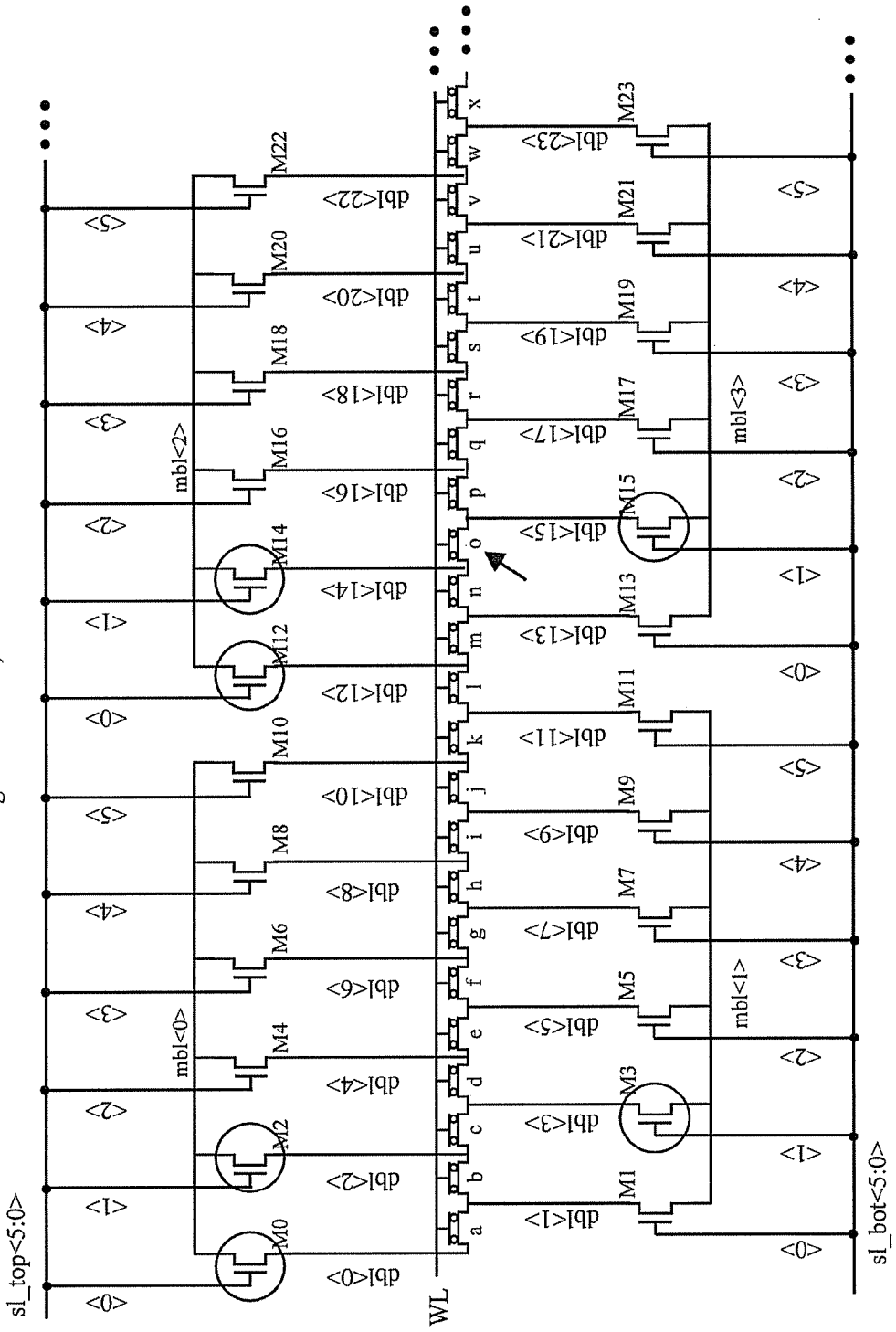

| Address | FIG. | MBL-0 | MBL-1 | MBL-2 | MBL-3 |
|---|---|---|---|---|---|
| Read addr 0 | FIG. 5 | Vdr | 0 v (gnd) | 0 v, or float 0 v | 0 v, or float 0 v |
| read addr 1 | FIG. 6 | Vdr | 0 v (gnd) | 0 v, or float 0 v | 0 v, or float 0 v |
| read addr 2 | FIG. 7 | Vdr | 0 v (gnd) | 0 v, or float 0 v | 0 v, or float 0 v |
| read addr 3 | FIG. 8 | Vdr | 0 v (gnd) | 0 v, or float 0 v | 0 v, or float 0 v |
| read addr 4 | FIG. 9 | Vdr | 0 v (gnd) | 0 v, or float 0 v | 0 v, or float 0 v |
| read addr 5 | FIG. 10 | Vdr | 0 v (gnd) | 0 v, or float 0 v | 0 v, or float 0 v |
| Pre charge | FIG. 11 | Vdr | Vdr | float | Float |
| read addr 6 | FIG. 12 | Float at Vdr | Float at Vdr | Vdr | 0 v (gnd) |
| read addr 7 | FIG. 13 | Float at Vdr | Float at Vdr | Vdr | 0 v (gnd) |

FIG. 5 illustrates a first step (Sequential read: Address 0) in the technique. For example, A signal <0> from sl_top turns on select transistor M0. This is indicated by the circle around M0. MBL-0 is set to 2 volts (Vdr).

The select transistor M12 is also turned on. MBL-2 is set to 0 volts (gnd), or is left floating.

A signal <0> from sl_bot turns on select transistor M1. This is indicated by the circle around M1. MBL-1 is set to 0 volts (gnd).

The select transistor M13 is also turned on. MBL-3 is set to 0 volts (gnd), or is left floating.

The "convention" of drawing a circle around the select transistors (M) that are turned "on" will be adhered to in the following figures.

With these two transistors M0 and M1 turned on, memory cell "a" can be read, using "drain-side" or source side sensing. This represents reading of "Address 0". (Refer to Table 1, logical address "0" corresponds to FC# "0", cell letter "a"). The left diffusion of memory cell "a", functioning as drain (D), is connected to metal bitline MBL-0, and the right diffusion of memory cell "a", functioning as source (S), is connected to metal bitline MBL-1. In an NROM cell, this would be "reverse read" of the right storage area (adjacent the source (S)) of the memory cell "b".

Although the two transistors M12 and M13 are turned on, the associated MBLs are left floating, so no reading of memory cell "m" is taking place.

FIG. 6 illustrates a next step (Sequential read: Address 1) in the technique. For example, A signal <1> from sl_top turns on select transistor M2. This is indicated by the circle around M2. MBL-0 is set to 2 volts (Vdr).

The select transistor M0 may be left turned on, by signal <0> from sl_top.

The select transistor M12 may be turned on by the signal <0>, and the select transistor M14 may also be turned on by the signal <1>. MBL-2 remains floating.

A signal <1> from sl_bot turn on select transistor M3. This is indicated by the circles around M3. MBL-1 is set to 0 volts (gnd).

The select transistor M15 may be turned on. MBL-3 remains floating.

With the two transistors M2 and M3 turned on, memory cell "c" can be read, using drain-side or source side sensing. This represents reading of "Address 1". (Refer to Table 1, logical address "1" corresponds to FC# "2", cell letter "c"). The left diffusion of memory cell "c", functioning as drain (D), is connected to metal bitline MBL-0, and the right diffusion of memory cell "c", functioning as source (S), is connected to metal bitline MBL-1.

Notice in FIG. 6 that according to Table 1) sl_top<1> is on and so is sl_top<0> (which was also on in the previous read cycle), and sl_bot<1>. This will charge the pipe which is faced by the drain side, that is, dbl's 0 and 2 will directly charged by MBL0 through sl_top<1> and sl_top<2> (dbl 2 is the active drain side) and dbl 1 will be charged through FC 'b' from dbl's 0 and 2, while dbl 3 is the source side through MBL1 and sl_bot<1>.

Although the two transistors M14 and M15 are turned on (M12 is also turned on), the associated MBLs are left floating, so no reading of memory cell "0" is taking place.

Note that in the previous (first)) step (FIG. 5), memory cell "a" (logical address 0, FC-0) was read, and in this (next) step (FIG. 6) memory cell "c" (logical address 1, FC-2, in Table 1) is read. This is indicative of the read sequence (or "read order") that will be followed, involving reading every other cell in the row of the array, skipping over one cell in each subsequent step.

Note also in FIG. 6 that both bitlines DBL-0 and DBL-2 are charged (+2 v) during the read cycle, and that M1 is turned off (note, it is not circled). Thus, the pipe to the left of the active DBL (DBL<2>) is charged, thereby reducing the pipe current and increasing the sensing accuracy.

FIG. 7 illustrates a next step (Sequential read: Address 2) in the technique. For example, A signal <2> from sl_; top turns on select transistor M4. This is indicated by the circle around M4. MBL-0 is set to Vdr The select transistors M0 and M2 may also be left on (and are circled)

The select transistor M16 is also turned on. MBL-2 remains floating. The select transistors M12 and M14 may also be left on (and are circles).

A signal <2> from sl_bot turn on select transistor M5 (circled), and MBL-1 is set to ground.

The select transistor M17 may also be turned on. MBL-3 remains floating.

With the two transistors M4 and M5 turned on, memory cell "e" can be read, using drain-side or source side sensing. This represents reading of "Address 2". (Refer to Table 1, logical address "2" corresponds to floating cell "4"). The left diffusion of memory cell "e", functioning as drain (D), is connected to metal bitline MBL-0, and the right diffusion of memory cell "e", functioning as source (S), is connected to metal bitline MBL-1.

Although the two transistors M16 and M17 are turned on, the associated MBLs are left floating, so no reading of memory cell "q" is taking place. (The transistors M12 and M14 may also be turned on.)

Note that in the previous step (FIG. 6), memory cell "c" (logical address 1, FC-2) was read, and in this (next) step (FIG. 7) memory cell "e" (logical address 2, FC-4, in Table 1) is read. This is indicative of the read sequence (or "read order") that will be followed, involving reading every other cell in the row of the array, skipping over one cell in each subsequent step.

Note also in FIG. 7 that the bitlines DBL-0, DBL-2 and DBL-4 are charged (+2 v) during the read cycle, and that M1 and M3 are turned off (not circled). Thus, the pipe to the left of the active DBL (DBL<4>) is charged, thereby reducing the pipe current and increasing the sensing accuracy.

FIG. 8 illustrates a next step (Sequential read: Address 3) in the technique. For example, A signal <3> from sl_top turns on select transistor M6. This is indicated by the circle around M6. MBL-0 is set to Vdr. The select transistors M0, M2 and M4 may be left turned on (by signals <0>, <1> and <2> from sl_top).

The select transistor M18 is also turned on. MBL-2 remains floating. The select transistors M12, M14 and M16 may be left turned on.

A signal <3> from sl_bot turn on select transistor M7. MBL-1 is grounded. Select transistor M19 may similarly be turned on. MBL-3 remains floating.

With the two transistors M6 and M7 turned on, memory cell "g" can be read, using drain-side or source side sensing. This represents reading of "Address 3". (Refer to Table 1, logical address "3" corresponds to floating cell "6"). The left diffusion of memory cell "g", functioning as drain (D), is connected to metal bitline MBL-0, and the right diffusion of memory cell "g", functioning as source (S), is connected to metal bitline MBL-1.

Although the two transistors M18 and M19 are turned on, the associated MBLs are left floating, so no reading of memory cell "t" is taking place. (M12, M14 and M16 are also turned on.)

Note that in the previous step (FIG. 7), memory cell "e" (logical address 2, FC-4) was read, and in this (next) step (FIG. 8) memory cell "g" (logical address 3, FC-6, in Table 1) is read. This is indicative of the read sequence (or "read order") that will be followed, involving reading every other cell in the row of the array, skipping over one cell in each subsequent step.

Note also in FIG. 8 that the bitlines DBL-0, DBL-2, DBL-4 and DBL-6 are charged (+2 v) during the read cycle, and that M1, M3 and M5 are turned off (not circled). Thus, the pipe to the left of the active DBL (DBL<6>) is charged, thereby reducing the pipe current and increasing the sensing accuracy.

FIG. 9 illustrates a next step (Sequential read: Address 4) in the technique. For example, A signal <4> from sl_top turns on select transistor M8. This is indicated by the circle around M8. MBL-0 is set to Vdr. Select transistors M0, M2, M4, M6 may remain "on".

The select transistor M20 is also turned on. MBL-2 remains floating.

A signal <4> from sl_bot turn on select transistor M9. MBL-1 is set to gnd. The select transistor M21 may be turned on. MBL-3 remains floating.

With the two transistors M8 and M9 turned on, memory cell "i" can be read, using drain-side or source side sensing. This represents reading of "Address 4". (Refer to Table 1, logical address "4" corresponds to floating cell "8"). The left diffusion of memory cell "i", functioning as drain (D), is connected to metal bitline MBL-0, and the right diffusion of memory cell "i", functioning as source (S), is connected to metal bitline MBL-1.

Although the transistors M20 and M21 are turned on, the associated MBLs are left floating, so no reading of memory cell "u" is taking place.

Note that in the previous step (FIG. 8), memory cell "g" (logical address 3, FC-6) was read, and in this (next) step (FIG. 9) memory cell "i" (logical address 4, FC-8, in Table 1) is read. This is indicative of the read sequence (or "read order") that will be followed, involving reading every other cell in the row of the array, skipping over one cell in each subsequent step.

Note also in FIG. 9 that the bitlines DBL-0, DBL-2, DBL-4, DBL-6 and DBL-8 are charged (+2 v) during the read cycle, and that M1, M3, M5 and M7 are turned off (not circled). Thus, the pipe to the left of the active DBL (DBL<8>) is charged, thereby reducing the pipe current and increasing the sensing accuracy.

FIG. 10 illustrates a next step (Sequential read: Address 5) in the technique. For example, A signal <5> from sl_top turns on select transistor M10. This is indicated by the circle around M10. MBL-0 is set to Vdr. Select transistors M0, M2, M4, M6, M8 may remain "on".

The select transistor M22 is also turned on. MBL-2 remains floating.

A signal <5> from sl_bot turn on select transistor M11. MBL-1 is set to gnd. The select transistor M23 may be turned on. MBL-3 remains floating.

With the two transistors M10 and M11 turned on, memory cell "k" can be read, using drain-side sensing. This represents reading of "Address 5". (Refer to Table 1, logical address "5" corresponds to FC#10). The left diffusion of memory cell "k", functioning as drain (D), is connected to metal bitline MBL- 0, and the right diffusion of memory cell "k", functioning as source (S), is connected to metal bitline MBL-1.

Although the transistors M22 and M23 are turned on, the associated MBLs are left floating, so no reading of memory cell "w" is taking place.

FIGS. 5-10 have illustrated a sequence of reading memory cells "a", "c", "e", "g", "i" and "k", which are arranged in a row of memory cells and which are selectively connected to metal bitline 0 (MBL-0) and metal bitline 1 (MBL-1), for reading the contents (stored Vt) of the memory cells.

A first cell "a" is read, the next cell "b" is not read (is skipped), the next cell "c" is read, the next cell "d" is not read, and so forth, as described above. What is evident is that the read order is organized so that the charge remains on the left, on the drain-side (for drain-side sensing, in other words, on the read-side or sensing node) of the cell being read. This minimizes the possibility of there being any stray capacitance on the drain-side of the cell being read, thereby enhancing read performance.

There has thus been described various aspects of the present disclosure, including, but not limited to:
  maintaining the metal bitlines (MBLs) for a group of cells being read at given voltages (such as MBL-0=0 volts and MBL-1=+2 volts),
  reading in an order which skips every other cell, and
  keeping open (on) the select transistors of neighboring cells which were previously read so as to keep their drain (read-side) bitlines (DBLs) charged.

FIG. 11 illustrates a next step (pre-charge phase) in the technique. Prior to reading cell "m" (logic add 6, cell letter "m", FC#12, see Table 1), a pre-charge step is performed. For example,
  A signal <0> and a signal <1> from sl_top turns on select transistors M0 and M2, as indicated by the circles around M0 and M2, and MBL-0 is maintained at Vdr.
  Select transistors M12 and M14 may also be turned on, but MBL-2 is maintained at float.
  Select signals <1>, <2>, <3> and <4> from sl_bot turn on select transistors M3, M5, M7 and M9 (and may also turn on select transistors M15, M17, M19 and M21), as indicated by the circles around M3, M5, M7 and M9, and MBL-1. MBL-1 is charged to Vdr.
  Select transistors M15, M17, M19 and M21 may also be turned on, but MBL-3 remains floating.

No reading is occurring in this step. Rather, the metal bitlines MBL-0 and MBL-1 are being pre-charged for reading the cell "m", between (M12 and M13) that will be read in the next phase. This is indicated by the dashed-line ( - - - ) circle around cell "m".

A pre-charge pulse is supplied to MBL-1, as is indicated by the arrow pointing up to MBL-1, generally under select transistor M7. Also, a pre-charge pulse is supplied to MBL-0, as indicated by the arrow pointing down to MBL-0, generally above select transistor M6. The pre-charge pulse may be at substantially the read voltage (Vdr), such as +2 volts.

A pre-charge current flows from MBL-1, through the associated at least one select transistors (M3, M5, M7 and M9) that are turned on, and from MBL-0 through the associated at least one select transistors (M0, M2) that are turned on. These current paths are indicated by:
  the arrows pointing up along DBL-3, DBL-5, DBL-7 and DBL-9,
  the arrows pointing down along DBL-0 and DBL-2, and
  the arrows pointing along the wordline WL between cells "a" and "j".

The main reason for the pre-charge step is to prepare MBL<1> to the next read cycle, because it was at ground level before, and in the next read cycle (as will be shown) it will be connected to the pipe through select transistor M1. Failing to pre-charge may cause the pipe to be discharged by MBL<1> in the next read cycle due to MBL<1>'s relatively large capacitance. In addition, turning select transistors M3, M5, M7, M9, M0 and M2 charge the pipe left to the next active drain (DBL<12>) preparing it to the next read cycle.

FIG. 12 illustrates a next step (Sequential read: Address 6) in the technique. For example,
  A signal <0> from sl_top turns on select transistor M12. This is indicated by the circle around M12. MBL-2 is set to 0 volts (ground).
  The select transistor M0 is also turned on. MBL-0 is left floating (at Vdr, from pre-charge phase).
  A signal <0> from sl_bot turns on select transistor M13. MBL-3 is set to Vdr.
  The select transistor M1 is also turned on. MBL-1 is left floating (at Vdr, from pre-charge phase).

With the two transistors M12 and M13 turned on, memory cell "m" can be read, using drain-side or source-side sensing. This represents reading of "Address 5". (Refer to Table 1, logical address "6" corresponds to floating cell "12"). The left diffusion of memory cell "m", functioning as drain (D), is connected to metal bitline MBL-3, and the right diffusion of memory cell "m", functioning as source (S), is connected to metal bitline MBL-2.

M0 and M1 are also on, but MBL1 and MBL0 are float, so there is no read from cell "a".

FIG. 13 illustrates a first step (Sequential read: Address 7) in the technique. For example,
  Signal <0> and <1> from sl_top turns on select transistors M12 and M14. MBL-2 is set to Vdr.
  The select transistors M0 and M2 are also turned on. MBL-0 is left floating (at Vdr, from pre-charge phase).
  A signal <1> from sl_bot turns on select transistor M15. MBL-3 is set to 2 volts.
  The select transistor M3 is also turned on. MBL-1 is left floating (at Vdr, from pre-charge phase).

With these two transistors M14 and M15 turned on, memory cell "o" can be read, using drain-side or source-side sensing. This represents reading of "Address 7". (Refer to Table 1, logical address "7" corresponds to floating cell "14"). The left diffusion of memory cell "o", functioning as drain (D), is connected to metal bitline MBL-2, and the right diffusion of memory cell "o", functioning as source (S), is connected to metal bitline MBL-3.

M2 and M3 are also on, but MBL1 and MBL0 are float, so there is no read from cell "c".

The remaining cells "q", "s", "u" and "w" . . . can be read following the scheme (procedures, strategy) outlined above.

Reading the Other Bits, and the Other Cells

As described above, with respect to FIGS. 5-13, the right bits of alternate memory cells "a", "c", "d", "g", "i", "k" and "m" (for example) may be performed. In each case, the left diffusion (see 325, FIG. 3) is used as drain (D) by being set to Vdr (approximately 2 volts), with the right diffusion (see 323, FIG. 3) being used as source (S) and set to 0 volts (ground). Generally, MBL-1 provides Vdr, and MBL-0 provides ground.

In order to read the other bit of the same memory cells, the voltages on MBL-0 and MBL-1 can simply be reversed, so that MBL-0 provides Vdr, and MBL-1 provides ground.

In order to read the other memory cells "b", "d", "f", "h", "j", "l" and "n" (for example), the following may be done. For example, to read the right bit of memory cell "b", set MBL-0 to Vdr and MBL-1 to ground, and turn on select transistors M0 and M1 so that DBL-0 carries Vdr and DBL-1 carries ground. And to read the left bit of the memory cell "b", set MBL-1 to Vdr and MBL-0 to ground, and turn on select transistors M0 and M1 so that DBL-1 carries Vdr and DBL-0 carries ground.

An exemplary "pattern" for performing drain-side sensing for the right bit of these other memory cells "b", "d", "f", "h", "j", "l" and "n" may be as follows, with reference to Table 3.

TABLE 3

Voltage Levels on Metal Bitlines

| Address | MBL-0 | MBL-1 | Select transistors "on" |
|---|---|---|---|
| read cell "b" | Vdr | 0 v (ground) | M0, M1 |
| read cell "d" | Vdr | 0 v (ground) | M2, M3 |
| read cell "f" | Vdr | 0 v (ground) | M4, M5 |
| read cell "h" | Vdr | 0 v (ground) | M6, M7 |
| read cell "j" | Vdr | 0 v (ground) | M8, M9 |
| read cell "l" | Vdr | 0 v (ground) | M10, M11 |
| read cell "n" | Vdr | 0 v (ground) | M12, M13 |

Another Exemplary Read Cycle

In this example, reading is started in the middle of a slice, rather than at an isolated end of the slice, as described hereinabove. Generally, in case that the initial read address is in the middle of the slice, the neighbor drain side should be filled up with charge, up to the drain voltage level, and this should be done prior to the read cycle.

This is presented in the following Table ("Table 4. Reading in the middle of a Slice") and is illustrated with respect to FIGS. 14-17.

The left side of Table 4 (below) describes the state of the select transistors and MBLs and DBLs state during the read cycle.

The right side of Table 4 (below) defines the state of the select and MBLs during the read cycle pre-pulse address phase used for pre-charge or discharge.

This exemplary sequence is illustrated with respect to FIGS. 14, 15, 16 and 17.

TABLE 4

Reading from the middle of a Slice

| Add | | | Read Cycle Address | | | | | |
|---|---|---|---|---|---|---|---|---|
| logic add | Cell letter | FC# | SL | | DBL | | MBL | |
| | | | t | b | D | S | D | S |
| 5 | k | 12 | 1, 2, 3, 4 <br> 1, 2, 3, 4 <br> 0, 1, 2, 3, 4, 5 | <br> 5 <br> 0, 1, 2, 3, 4, 5 | 10 | 11 | Pre-charge 0 <br> 0 <br> Pre-charge 0, 1 | 1 |
| 6 | m | 14 | 0 | 0 | 12 | 13 | 2 | 3 |

Figure 14:
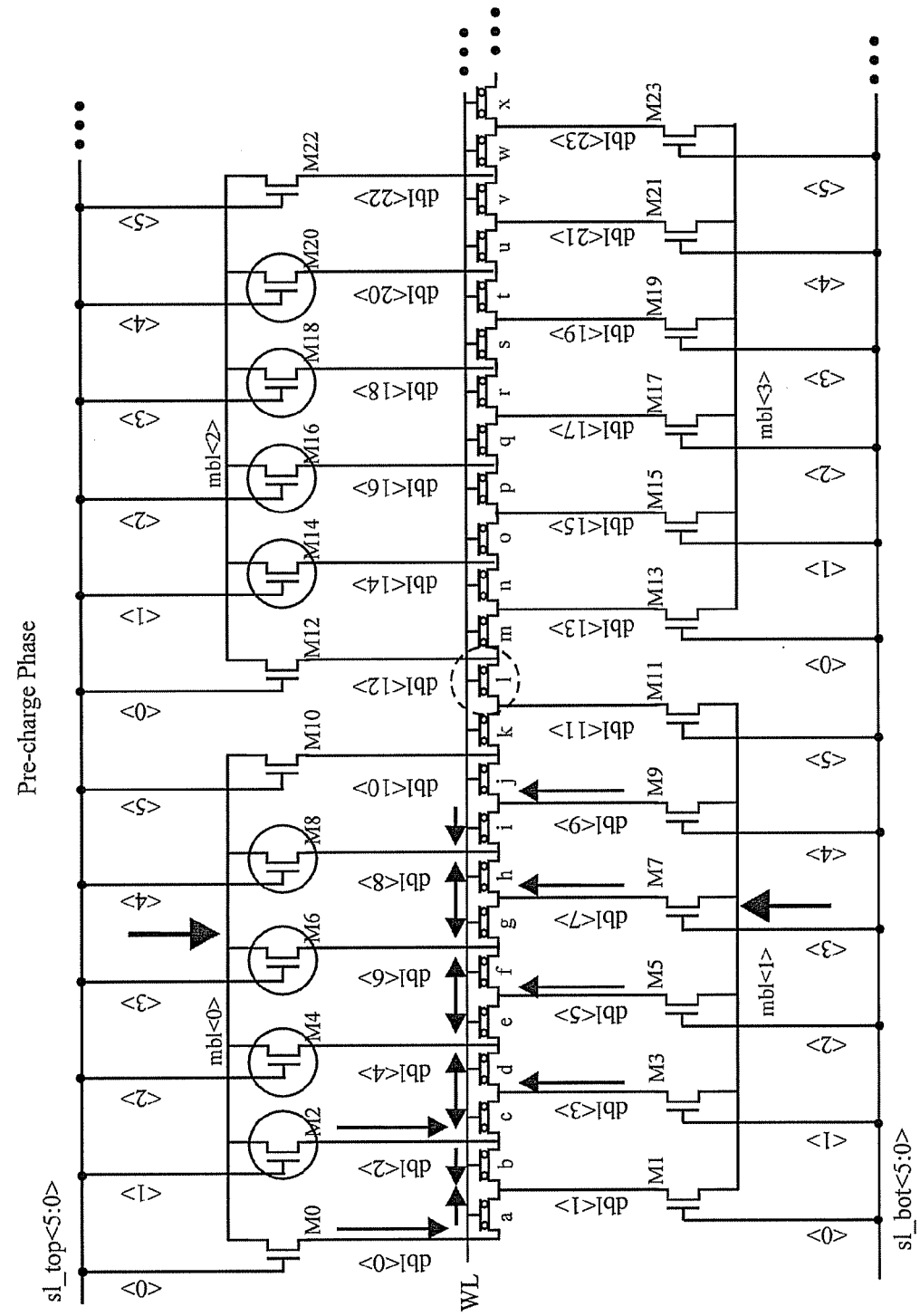
FIGS. 14-17 are schematic illustrations of a row (or slice) of memory cells, illustrating an embodiment of a method of reading the memory cells, according to the disclosure.

FIG. 14 illustrates a first step, which is a pre-charge phase. Note the dashed-line circle around cell "1", which indicates that the memory cell "1" is going to be read in next cycle. For example:

Signal <1>, <2>, <3> and <4> from sl_top turns on select transistors M2, M4, M6, M8. MBL-0 is set to Vdr, to fill it up with charge.

Select transistors M14, M16, M18 and M20 are also on. MBL-2 is set to ground (gnd) or allowed to float.

There are no signals from sl_nbot. MBL-1 is set to Vdr, to fill it up with charge.

MBL-3 is set to ground (gnd) or allowed to float.

The metal bitlines MBL-0 and MBL-1 are pre-charged.

Figure 15:
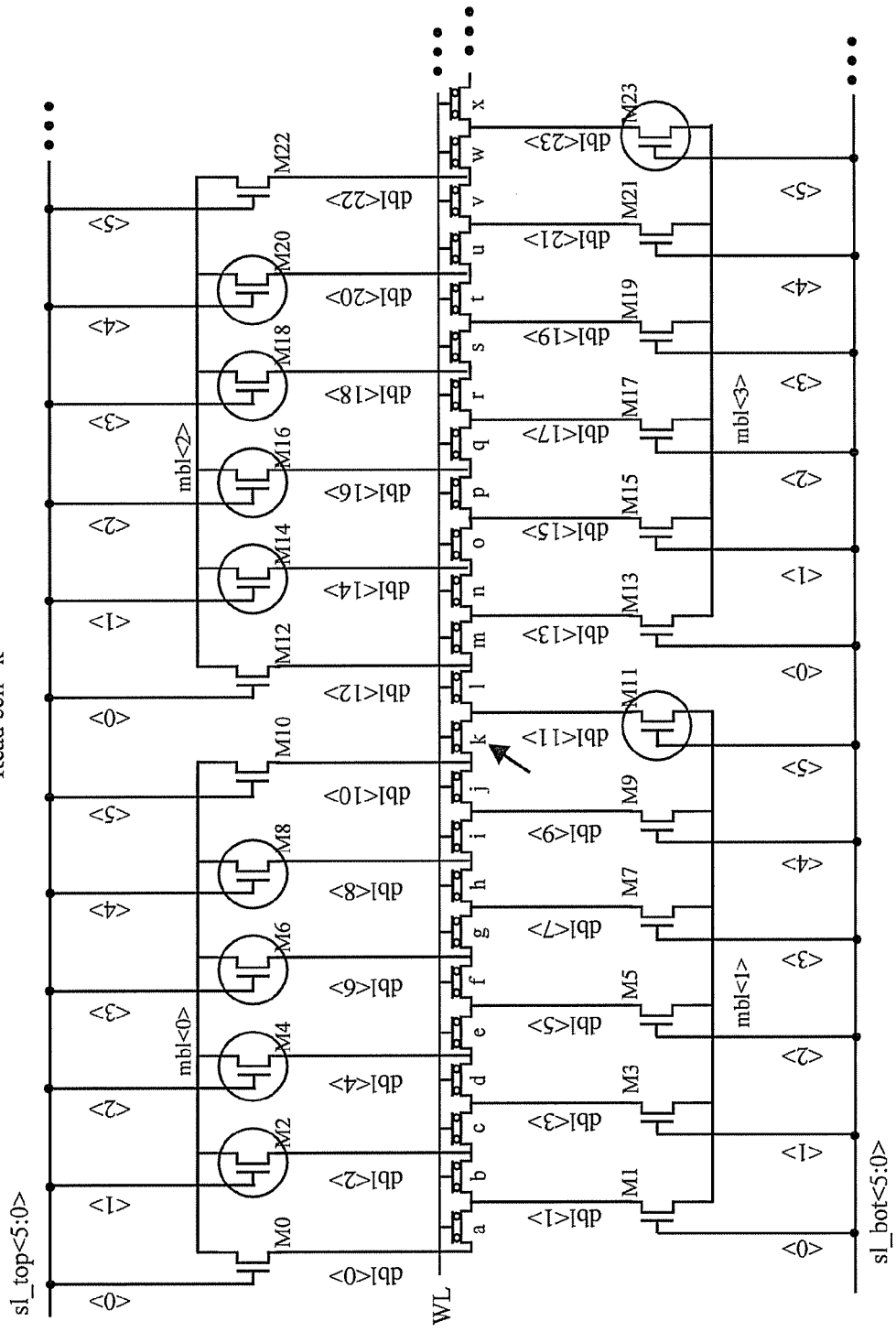

FIG. 15 illustrates reading cell "k" (logic address 5). For example,

Signals <1>, <2>, <3>, <4> from sl_top turn on selects transistor M2, M4, M6, M8. (same as pre-charge step, FIG. 14). MBL-0 is set to Vdr.

The select transistors M14, M16, M18, M20 are also turned on. MBL-2 is floating.

A signal <5> from sl_bot turn on select transistor M11. MBL-1 is set to gnd. The select transistor M23 may be turned on. MBL-3 remains floating.

With the two transistors M10 and M11 turned on, memory cell "k" can be read, using drain-side sensing. This represents reading of "Address 5". (Refer to Table 4, logical address "5" corresponds to FC#12, cell "k"). The left diffusion of memory cell "k", functioning as drain (D), is connected to metal bitline MBL-0, and the right diffusion of memory cell "k", functioning as source (S), is connected to metal bitline MBL-1.

Although the transistors M22 and M23 are turned on, the associated MBLs are left floating, so no reading of memory cell "w" is taking place.

Subsequent (every other) cells, such as "m", "o", "q", "s" . . . can be read in the manner described hereinabove.

Figure 16:
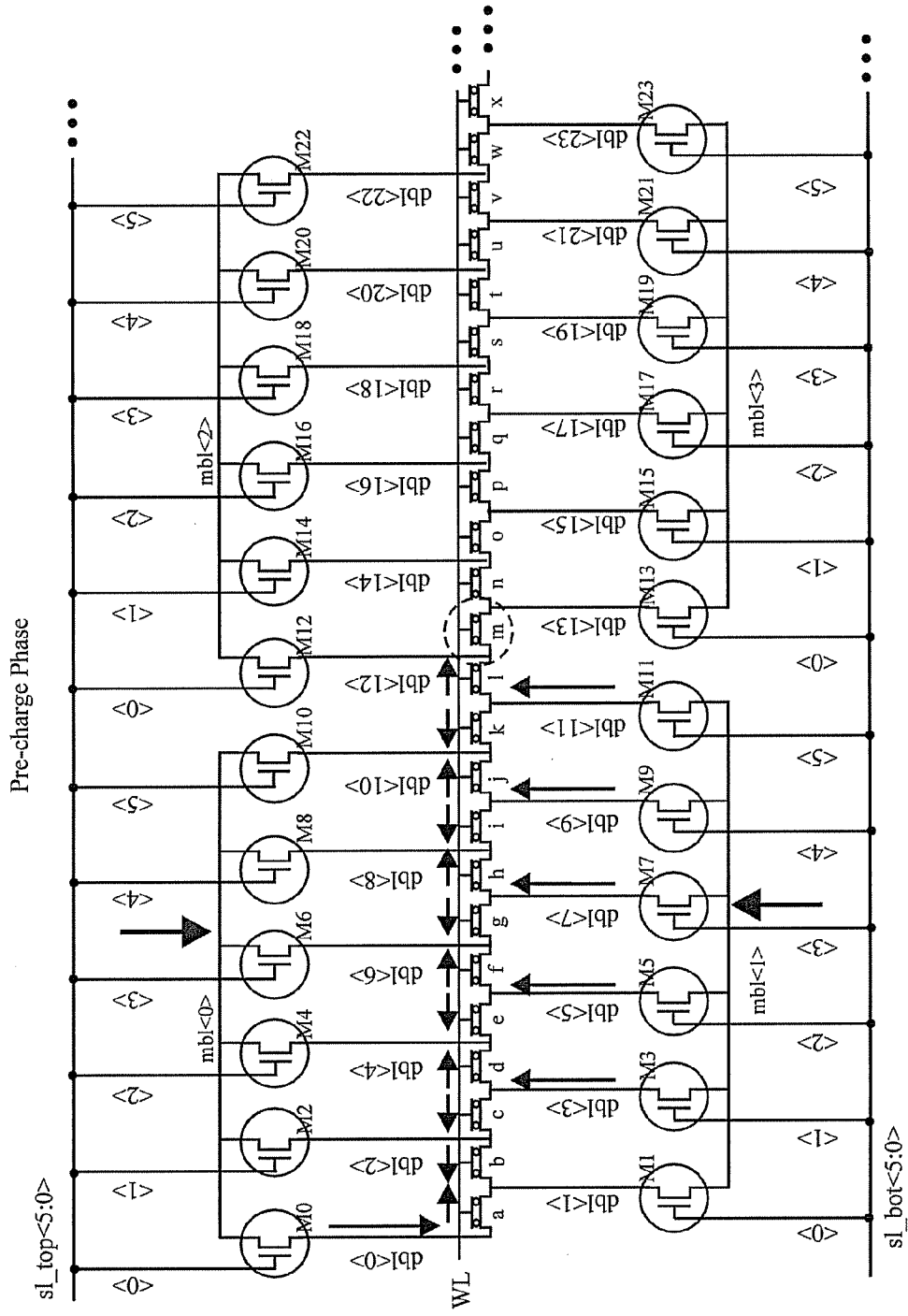

FIG. 16 illustrates a pre-charge phase prior to commencing reading at Address 6. Note the dashed-line circle around cell "m", which indicates that the memory cell "m" is going to be read in next cycle. For example, Signals <0>, <1>, <2>, <3>, <4>, <5> from sl_top turn on selects transistor M0, M2, M4, M6, M8, M10. MBL-0 is set to Vdr, filled up with charge.

The select transistors M12, M14, M16, M18, M20, M22 are also turned on. MBL-2 is floating.

Signals <0>, <1>, <2>, <3>, <4>, <5> from sl_bot turn on selects transistor M1, M3, M5, M7, M9, M11. MBL-1 is set to Vdr, filled up with charge.

The select transistors M13, M15, M17, M19, M21, M23 are also turned on. MBL-3 is floating.

Figure 17:
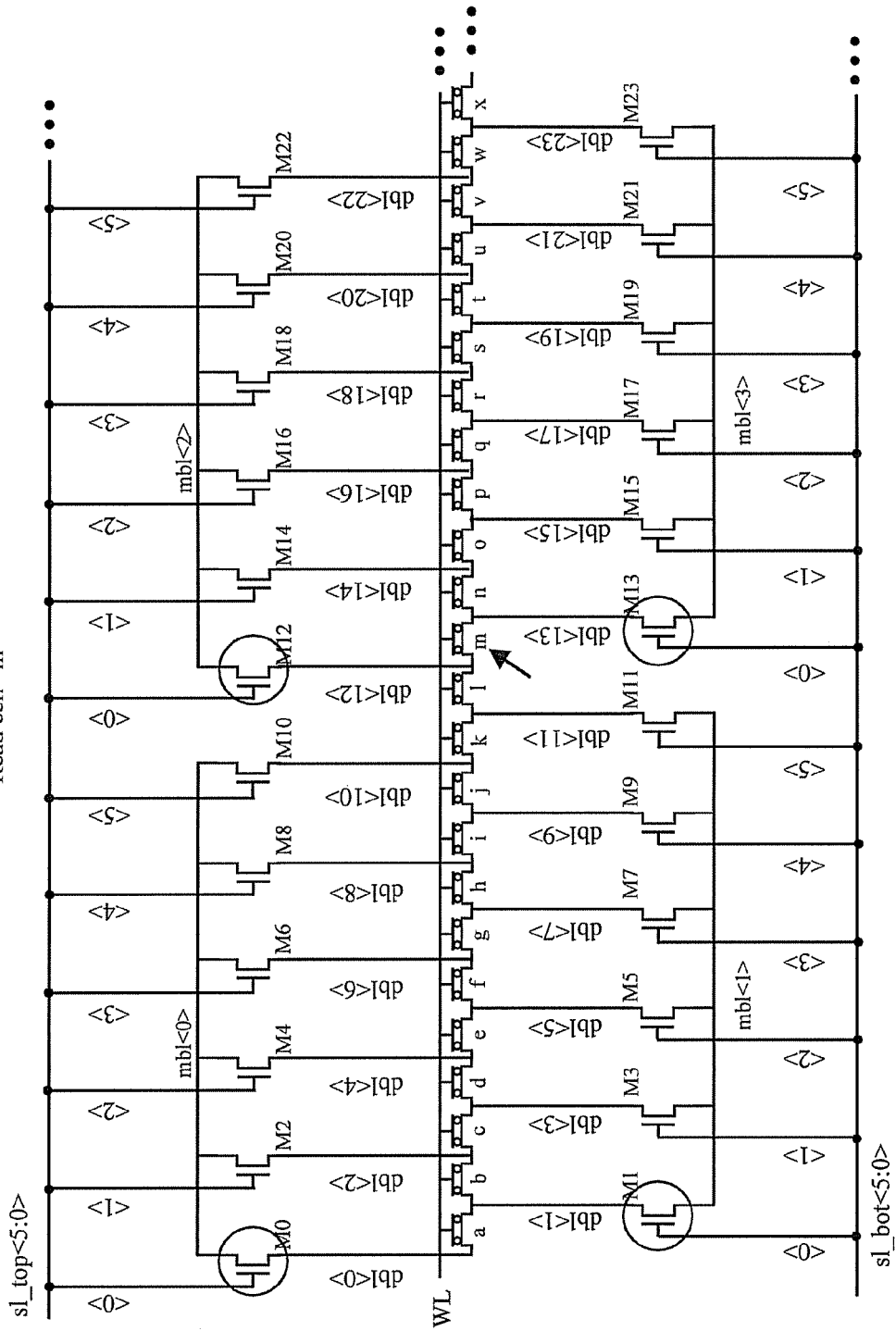

FIG. 17 illustrates reading cell "m" (address 6, Table 4). For example,

Signal <0> from sl_top turns on select transistors M0 and M12. MBL-0 is left floating (cell "a" will not be read). MBL-2 is set to Vdr, for reading cell "m".

Signal <0> from sl_bot turns on select transistors M1 and M13. MBL-0 is left floating (cell "a" will not be read). MBL-2 is set to gnd, for reading cell "m".

Subsequent (every other) cells, such as "o", "q", "s" . . . can be read in the manner described hereinabove.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A non-volatile memory ("NVM") device comprising NVM cells in an NVM array; and
control logic to cause a circuit to pre-charge or discharge one or more bitlines not directly connected with one or more NVM cells being read, wherein pre-charging or discharging comprises pre-charging or discharging several global bitlines and local bitlines, and wherein the selection of the global bitlines is done according to whether these global bitlines will interfere with sensing during a next read cycle.

2. The device of claim 1, wherein said control logic further causes reading of said one or more NVM cells to occur in an order which keeps a sensing node of said cells being read facing a bitline which has been pre-charged or discharged.

3. The device of claim 1, wherein the pre-charged or discharged global bit lines are selected according to a pre-defined table per each address.

4. A non-volatile memory ("NVM") device comprising:
   a plurality of non-volatile memory (NVM) cells which are arranged in a row of memory cells and which are selectively connected to a first bitline and a second bitline, wherein one of the bitlines is a sensing node; and
   control logic to cause a circuit to pre-charge or discharge global bitlines and local bitlines, wherein the pre-charged or discharged global bit lines are selected so as to mitigate pipe effect during a next read cycle, and to perform read in an order which keeps a sensing node facing a bitline which was precharged or discharged.

5. The device of claim 4 wherein the pre-charged or discharged global bit lines are selected according to a pre-defined table per each address.

* * * * *